US007923999B2

(12) United States Patent
Edelstein

(10) Patent No.: US 7,923,999 B2
(45) Date of Patent: Apr. 12, 2011

(54) MEMS DEVICE WITH SUPPLEMENTAL FLUX CONCENTRATOR

(75) Inventor: Alan S. Edelstein, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 12/536,213

(22) Filed: Aug. 5, 2009

(65) Prior Publication Data

US 2011/0062956 A1    Mar. 17, 2011

Related U.S. Application Data

(60) Provisional application No. 61/088,906, filed on Aug. 14, 2008, provisional application No. 61/089,385, filed on Aug. 15, 2008.

(51) Int. Cl.
*G01R 33/02* (2006.01)
(52) U.S. Cl. .......................... 324/260; 324/244
(58) Field of Classification Search ............ 324/207.21, 324/207.2, 249, 251, 252, 244, 260, 262
See application file for complete search history.

(56) References Cited

U.S. PATENT DOCUMENTS

| 4,864,237 | A | 9/1989 | Hoenig |
|---|---|---|---|
| 5,942,895 | A | 8/1999 | Popovic et al. |
| 6,487,864 | B1 * | 12/2002 | Platt et al. .................. 62/3.2 |
| 6,501,268 | B1 | 12/2002 | Edelstein et al. |
| 6,670,805 | B1 | 12/2003 | Bahr et al. |
| 6,670,809 | B1 | 12/2003 | Edelstein et al. |
| 7,046,002 | B1 | 5/2006 | Edelstein |
| 7,185,541 | B1 | 3/2007 | Edelstein |
| 7,195,945 | B1 | 3/2007 | Edelstein |

OTHER PUBLICATIONS

Guedes, et al., "Hybrid magnetoresistive/microelectromechanical devices for static field modulation and sensor 1/f noise cancellation," Journal of Applied Physics 103, 07E924 (2008).
Veerdonk, et al., "1/f noise in anisotropic and giant magnetoresistive elements,"Journal of Applied Physics,82, 6152 (1997).
Edelstein, et al., "Minimizing the Effect of 1/f Noise with a MEMS Flux Concentrator" Sensors, 2004. Proceedings of IEEE Oct. 24-27, 2004, pp. 1562-1565 vol. 3 ISBN: 0-7803-8692-2.

(Continued)

*Primary Examiner* — Kenneth J Whittington
(74) *Attorney, Agent, or Firm* — Lawrence E. Anderson

(57) ABSTRACT

A microelectromechanical modulating magnetic device comprising: a base; a magnetic transducer that provides an output in response to a magnetic field associated with the base; at least one movable flux concentrator positioned to move relative to the magnetic transducer; at least one flux collector positioned to collect flux for transfer onto at least one movable flux concentrator; which transfers the magnetic flux to the magnetic transducer for detection and measurement purposes; support structure for enabling the at least one movable flux concentrators to move within a predetermined frequency range; a power source for causing the movable flux concentrators to move at a frequency within the predetermined frequency range; whereby magnetic flux may enter through the flux collector, pass through the at least one movable flux concentrator for transfer to the magnetic transducer, and due to the movement of the movable flux concentrator, the signal outputted from the transducer is modulated.

20 Claims, 28 Drawing Sheets

OTHER PUBLICATIONS

Edelstein, et al., "Minimizing 1/f Noise in Magnetic Sensors With a MEMS Flux Concentrator," Dec. 2004, DTIC handle.dtic.mil/100.2/ADA409302.

Edelstein, et al., "The MEMS Flux Concentrator: Potential Low-Cost, Highsensitivity Magnetometer" Nov. 1, 2006, DTIC handle.dtic.mil/100.2/ADA481427, Defense Technical Information CenterAccession No. ADA481427.

Edelstein, et al., "Progress toward a thousandfold reduction in 1/f noise in magnetic sensors using an ac microelectromechanical system flux concentrator," J. Appl. Phys., 99, 08B317/1-6 (Apr. 27, 2006).

Edelstein, et al., "Minimizing 1/f noise in magnetic sensors using a microelectromechanical system flux concentrator," J. Appl. Phys., 91, 7795-7797 (2002).

Edelstein, et al., "Minimizing 1/f Noise in Magnetic Sensors using an AC MEMS Flux Concentrator," Materials Research Society Fall 2005 Meeting.

\* cited by examiner

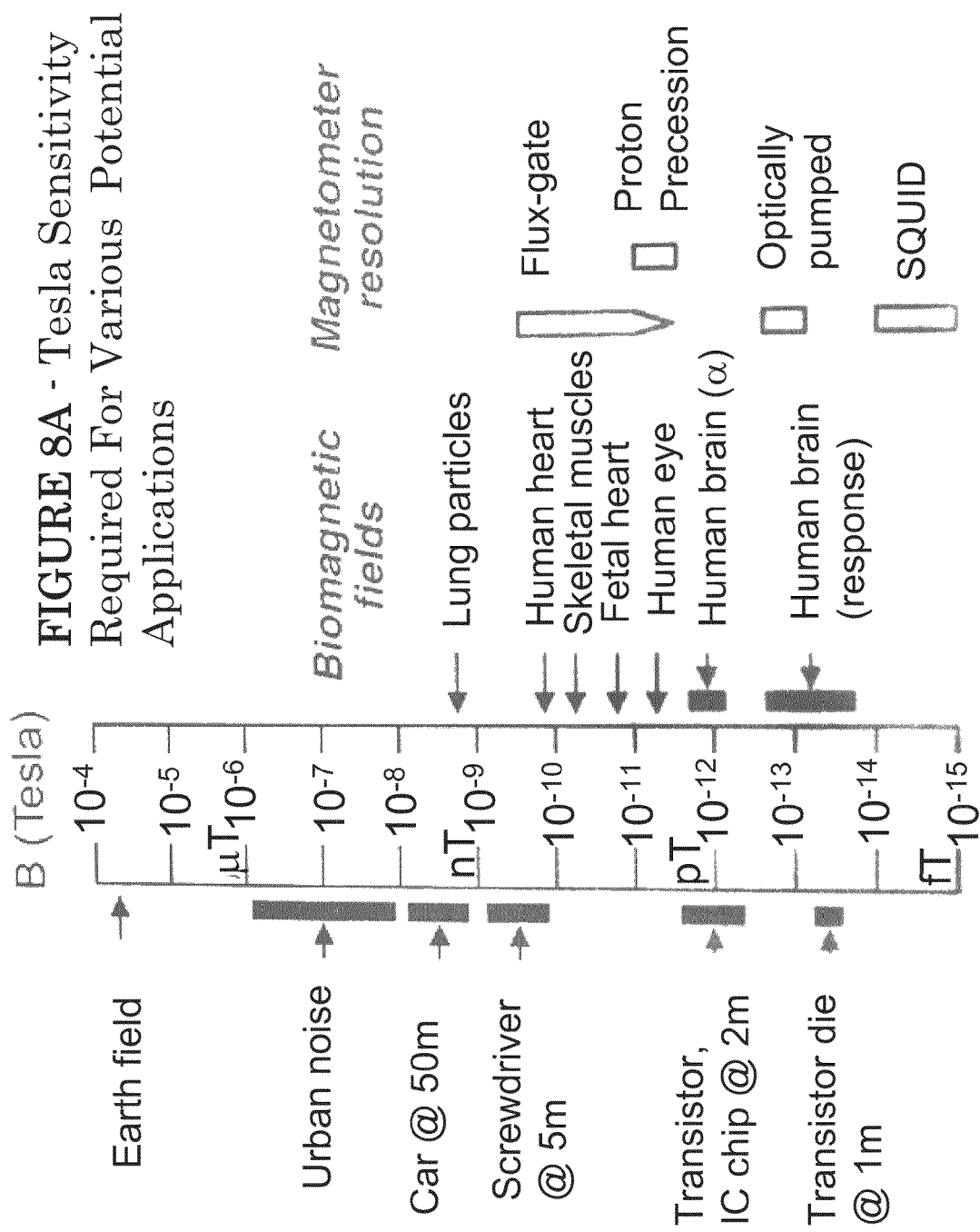

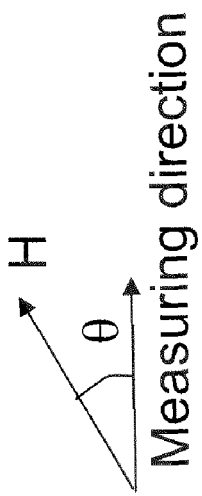
VECTOR FIELD MAGNETOMETERS
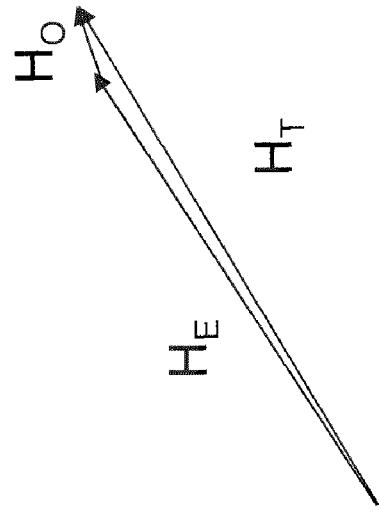
TOTAL FIELD MAGNETOMETERS
FIGURE 8B

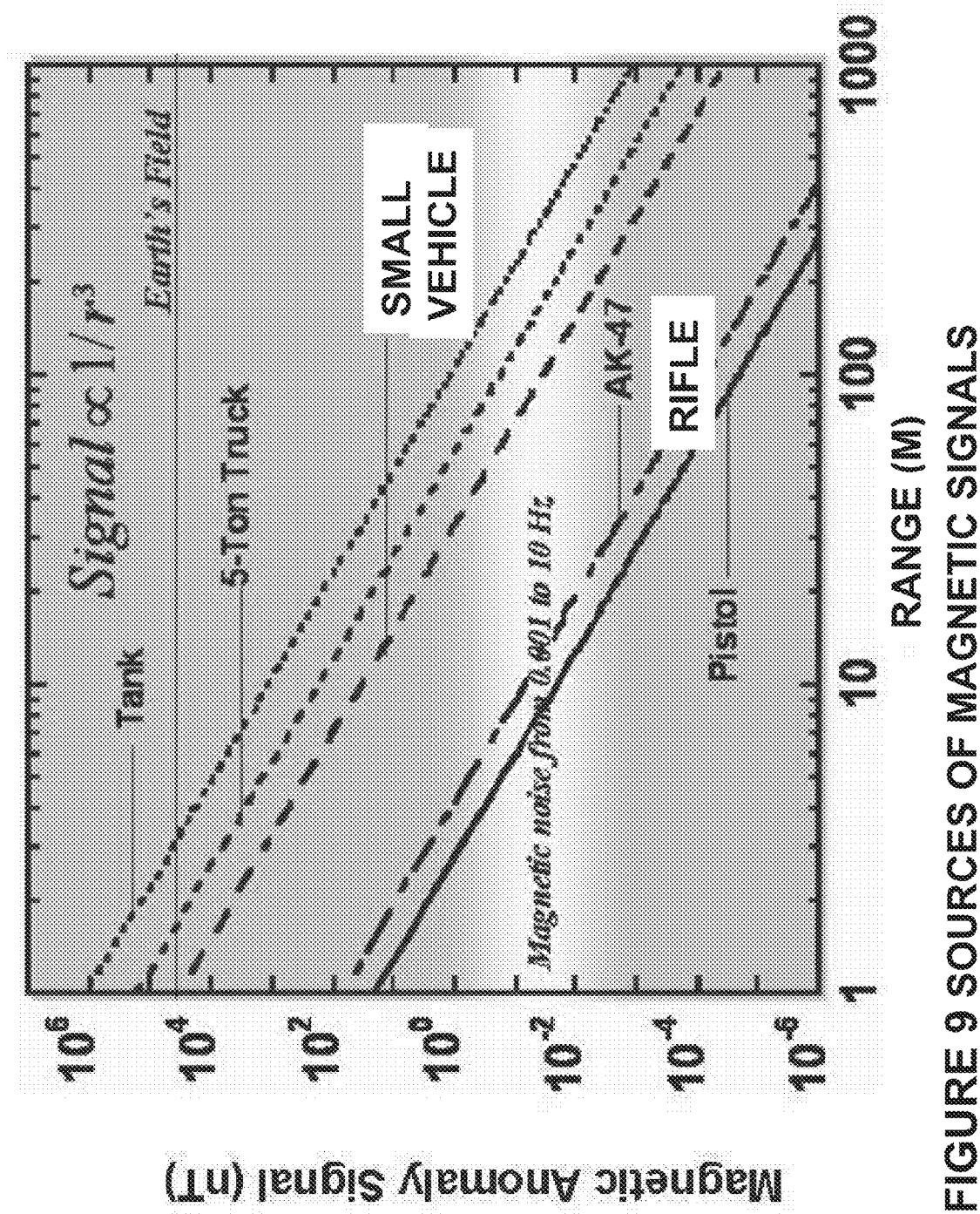
FIGURE 9 SOURCES OF MAGNETIC SIGNALS

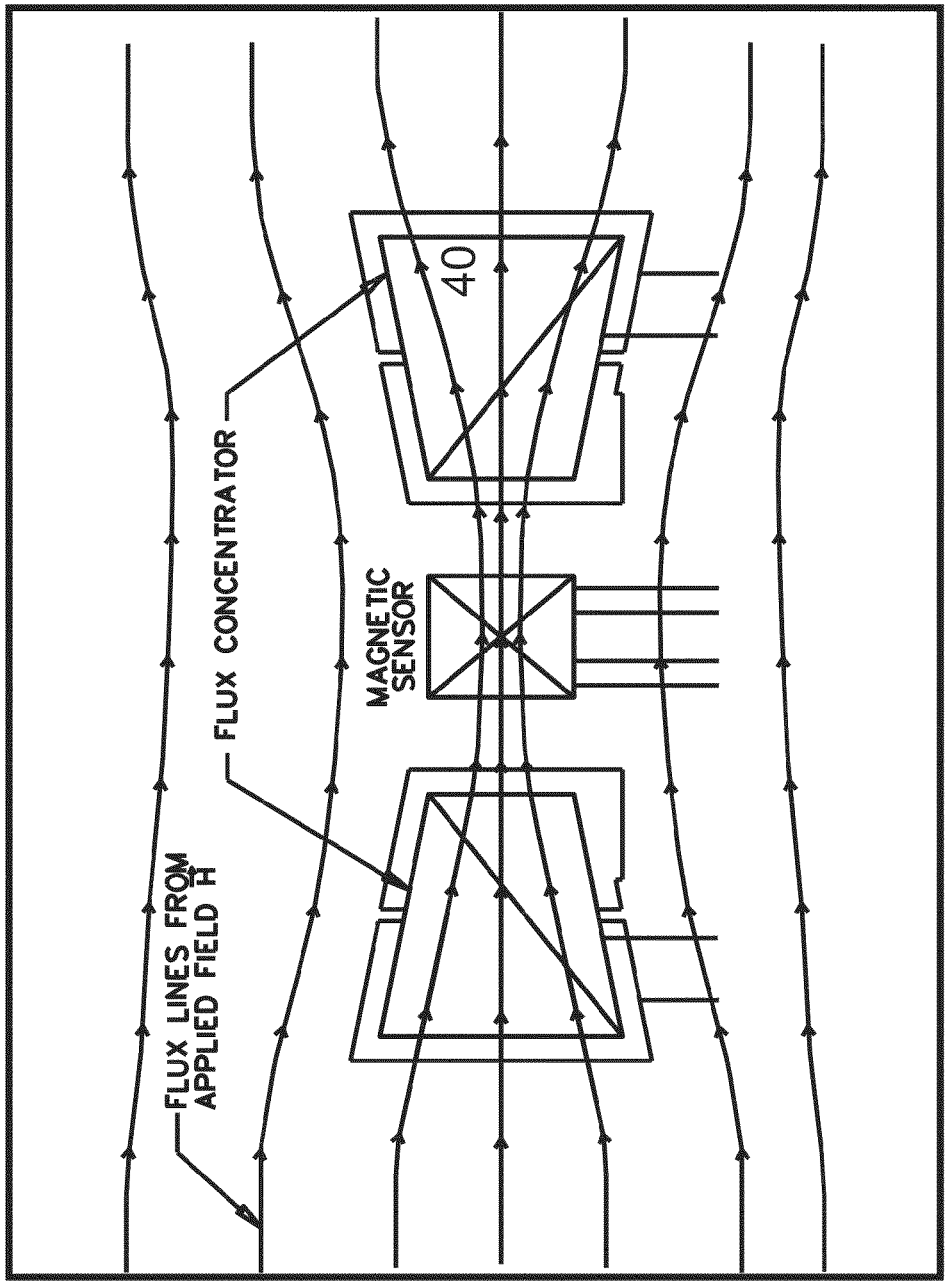

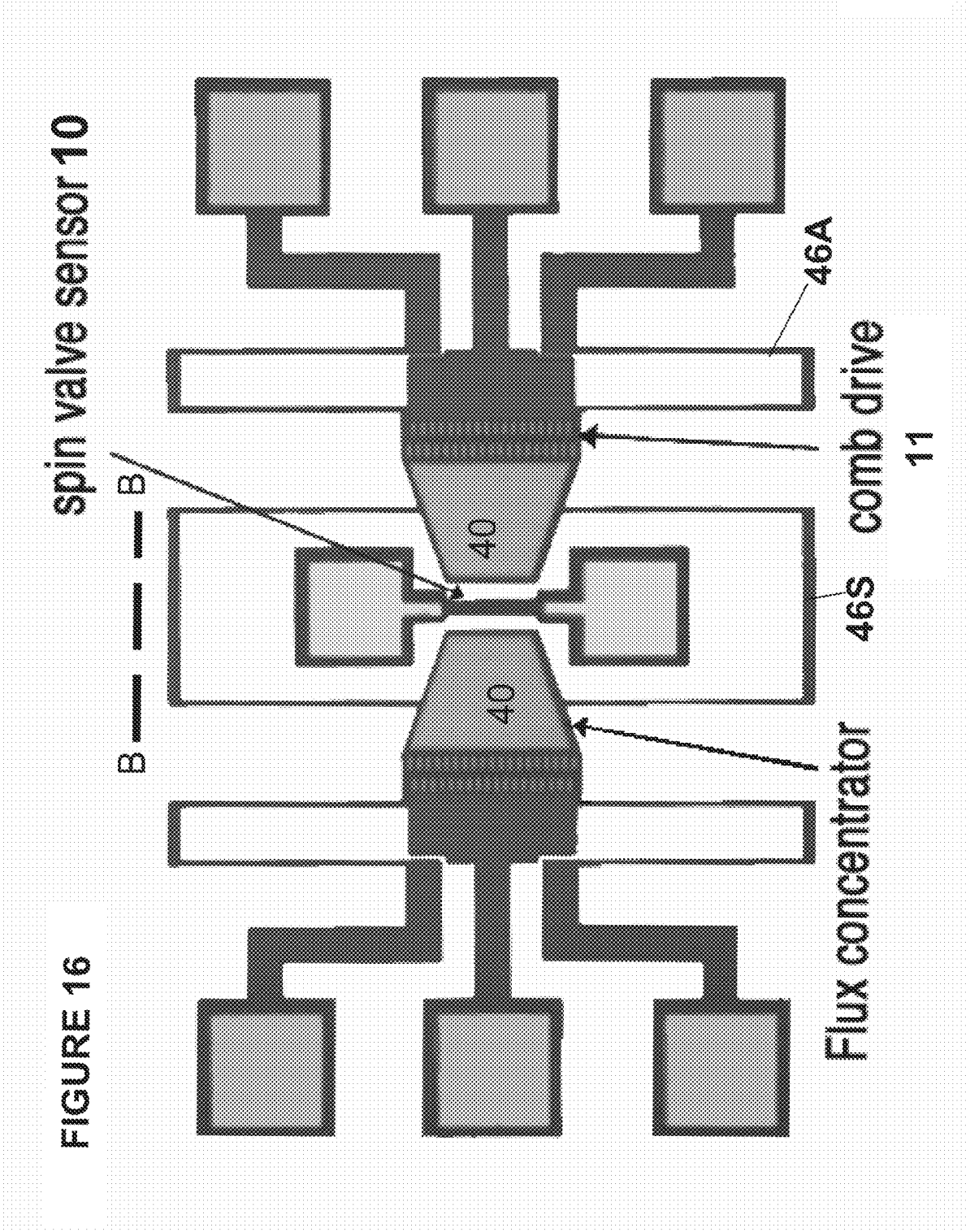

FIGURE 17A Testing MEMS Structure
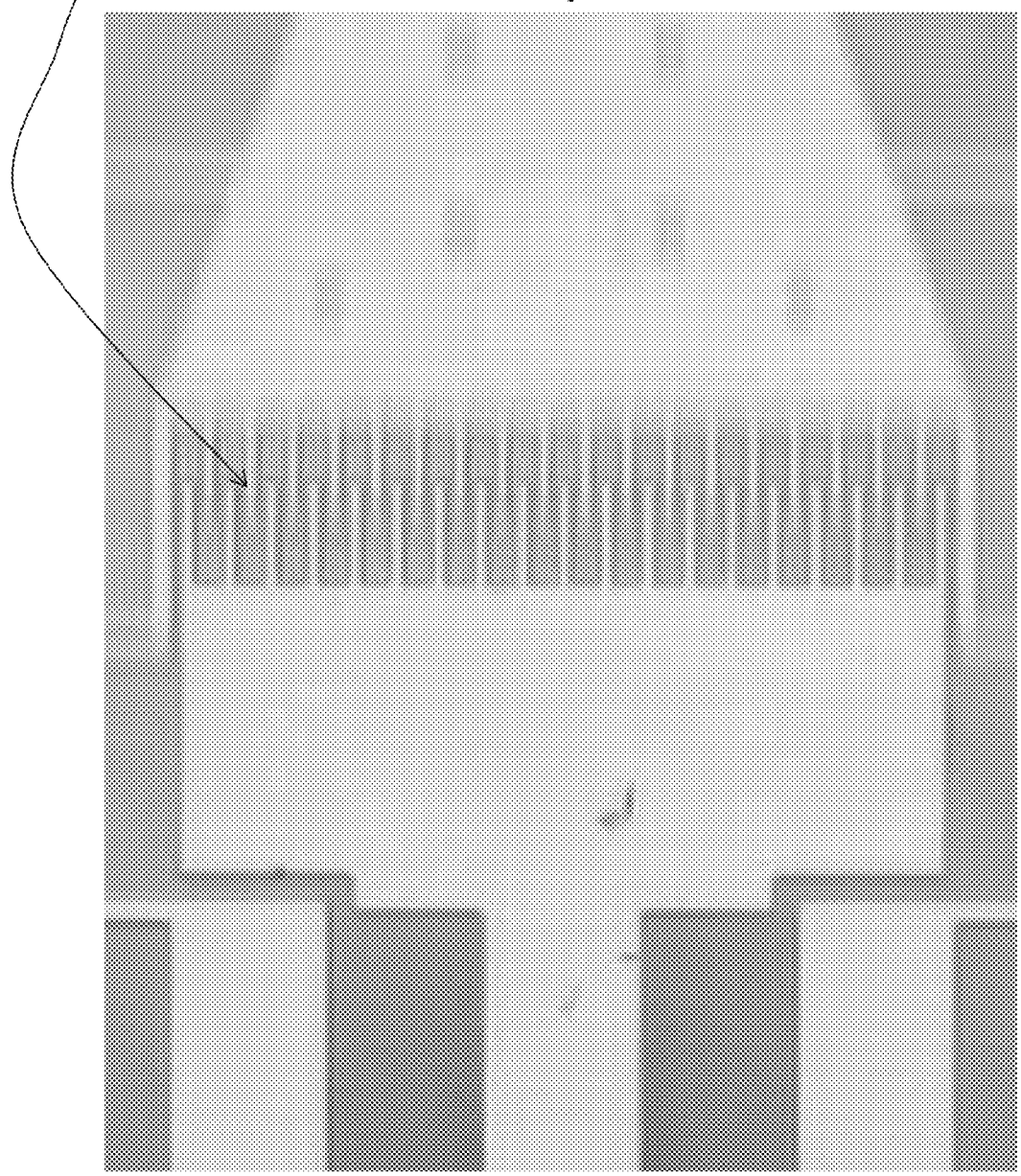
Motion at desired normal mode resonance
15 kHz    5 micron amplitude

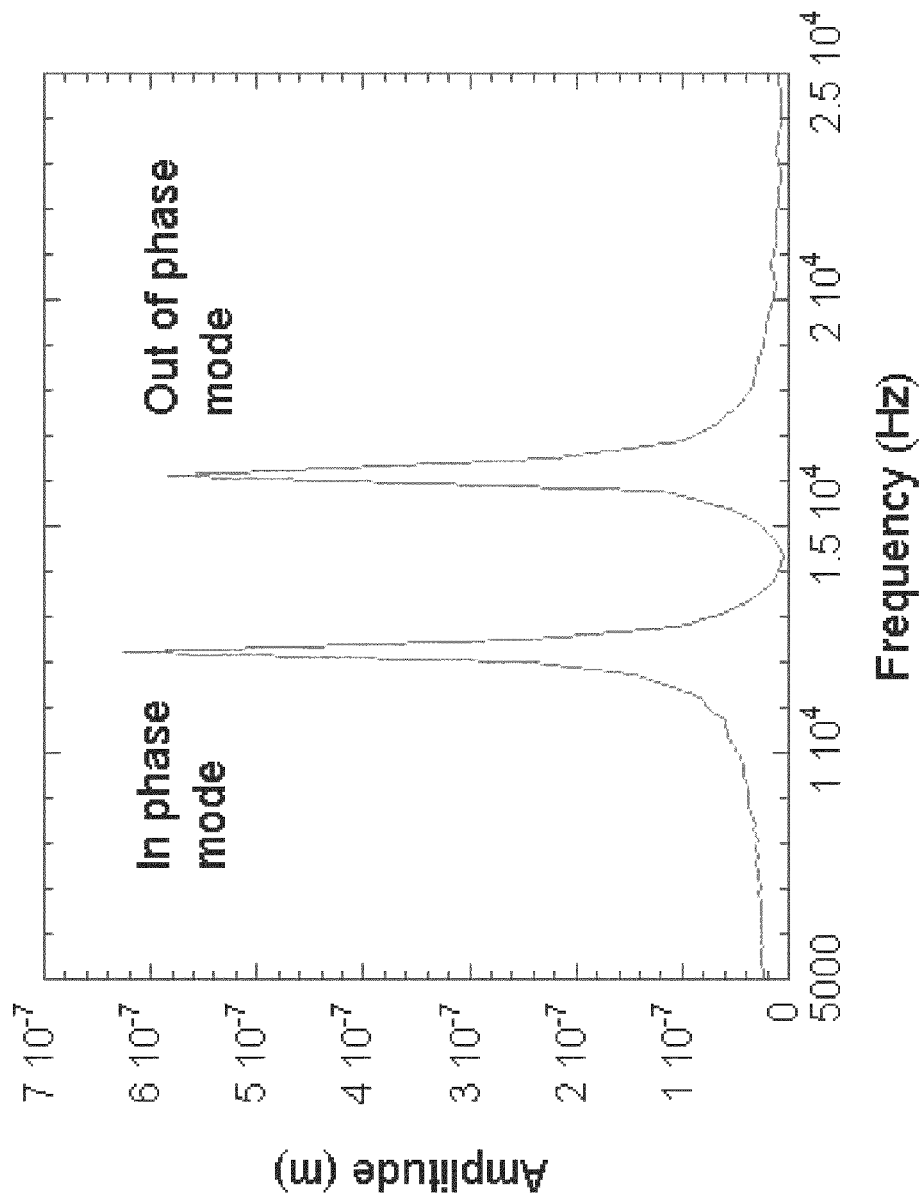
FIGURE 17B Normal Mode Resonant Frequencies

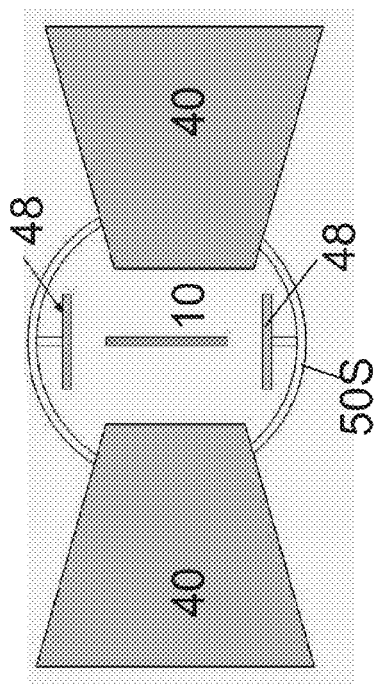
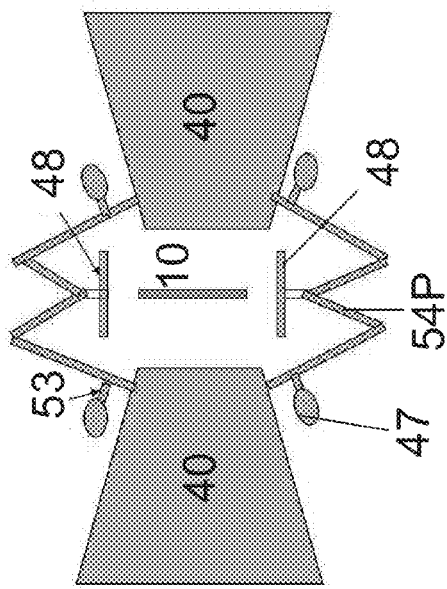

MEMS DEVICE WITH SUPPLEMENTAL FLUX CONCENTRATOR

CROSS REFERENCE TO RELATED APPLICATIONS

This application claims priority to U.S. Provisional Application No. 61/088,906 filed Aug. 14, 2008, and U.S. Provisional Application No. 61/089,385, filed Aug. 15, 2008, both of which are hereby incorporated by reference as though fully rewritten herein.

STATEMENT OF GOVERNMENT INTEREST

The invention described herein may be manufactured, used, and licensed by or for the United States Government.

FIELD OF THE INVENTION

This invention relates broadly to sensors and in particular to the detection of magnetic flux fields.

BACKGROUND OF THE INVENTION

Magnetic sensor devices can be used in a variety of fields including communications, defense, magnetic field sensors, medical, transportation, homeland security, computers, manufacturing, mineral exploration, underground infrastructure, and transportation. Depending upon the application, there are various requirements, factors, and tradeoffs such sensitivity, cost, and power consumption that must be considered for the various applications. For example, for automotive and high volume applications the prime factor is cost. In neuromagnetism the prime factor is sensitivity. For use in unattended ground sensor networks the prime factors are cost, sensitivity, power consumption, and visibility. For Department of Defense purposes, the Army requires magnetic sensors that can be used in unattended ground sensors (UGS) networks, at choke points, for mine detection, and general situational awareness. The Navy has applications in areas such as anti-submarine warfare (ASW), mine detection, harbor control, and checking demagnetization of ships. The Air Force has related uses.

Further examples of uses of magnetic detection devices include identification and financial credit cards, Government facilities protection, airport security, border control, drug control & enforcement, tunnel & underground facilities detection, navigation equipment, traffic light control, and ensuring airplane doors are securely closed (detection).

Illustrated in FIG. 8A is a chart showing the Tesla sensitivities required for various potential applications; e.g., drug delivery and cardiomagnetism, which requires sensitivity on the order of 10 pT (pico Tesla) and is presently done with SQUIDS. Another application is neuromagnetism which operates around 100 fT ($10^{-15}$) and is presently done with SQUIDS.

As to the types of magnetometers, as illustrated in FIG. 8B, scalar magnetometers measure the total strength (or total field), i.e., the magnitude of the magnetic field to which they are subjected, and vector magnetometers have the capability to measure the vector component of the magnetic field in a particular direction. The use of three orthogonal vector magnetometers allows the magnetic field strength, inclination and declination to be uniquely defined. Examples of vector magnetometers are fluxgates, and superconducting quantum interference devices (SQUIDs). Other examples of vector sensors are coil based, magnetoresistive, and hall effect sensors.

FIG. 8C shows the approximate Tesla ranges for the basic kinds of magnetic sensors, vector and total field magnetometers, with the frequency range plotted against Tesla sensitivity. Total magnetometers use the field dependence of quantum energy levels. Types of total field magnetometers include proton precession magnetometers, Overhauser magnetometers (which increase nuclear polarization via hyperfine interaction to electron's moment), and optically pumped magnetometers that usually use Cs or Rb; uncertainty principal limits precision at high sampling rate.

FIG. 9 is a graphical illustration of magnetic noise from various weapons and vehicles showing the magnetic anomaly signal versus the range in meters.

FIG. 9A graphically represents the 1/f noise versus frequency.

FIG. 8B is a graphical illustration of the problems associated with the total field and vector magnetometers.

FIG. 8B shows the relative reference distinctions between total field and vector sensors. The advantages and disadvantages are shown in the following table.

| Type of Sensor | Advantages | Disadvantages |
|---|---|---|
| Total Field Sensors | Sensitive Insensitive to rotational Vibrations | Costly, best at low frequencies |
| Fluxgate | Sensitive | Costly, large, consumes a lot of power |
| Coil based | Sensitive at high frequencies | Insensitive at low frequencies, costly, large |
| Magnetoresistive | Low cost, small, potentially sensitive | 1/f noise |

Vector magnetometers provide more information but are affected by rotational vibrations, which makes them difficult to use on vehicles. Vector magnetometers include SQUID, coil based, Fluxgate and Manetoresistive, and Hall effect. Total field measurements usually does not measure the total field from an object; but generally measures the projection of the total field from an object on earth's total field. Total field magnetic sensors include optically pumped, Overhauser, proton precession magnetometers and Nuclear precession. Total field magnetometers employ the field dependence of quantum energy levels.

Examples of patented MEMS devices include U.S. Pat. No. 6,501,268 to Edelstein, et al., entitled "MAGNETIC SENSOR WITH MODULATING FLUX CONCENTRATOR FOR 1/F NOISE REDUCTION," U.S. Pat. No. 6,670,809 to Edelstein, et al., also entitled "MAGNETIC SENSOR WITH MODULATING FLUX CONCENTRATOR FOR 1/F NOISE REDUCTION," and U.S. Pat. No. 7,195,945, to Edelstein, et al., entitled "MIMIMIZING THE EFFECT OF 1/F NOISE WITH A MEMS FLUX CONCENTRATOR," all three of which are hereby incorporated by reference as though fully rewritten herein. An example of a publication disclosing a MEMS device is found in an article entitled "Hybrid Magnetoresistive/microelectromechanical Devices for Static Field Modulation and Sensor 1/f Noise Cancellation," by A. Guedes et al., Journal of Applied Physics 103, 07E924 (2008). The Guedes article reported that low frequency 1/f noise in magnetoresistive MR spin valve sensors was suppressed by modulating an external dc magnetic field at high frequency microelectromechanical system using a MEMS microcantilever structure with an integrated magnetic flux guide. With this hybrid MR/MEMS device, direct detection of dc magnetic fields in the sensor high frequency thermal noise regime was reportedly achieved. The microcantilever was actuated using a gate electrode by applying an ac voltage with frequency f, causing it to oscillate at 2f. Measurements were reported to show detection of a dc magnetic field at 2f frequency (400 kHz), where sensor 1/f noise is two orders of magnitude lower than dc.

There has been a focus on magnetoresistive sensor technology because of the opportunity for producing low cost magnetic sensors. Magnetic sensors or transducers are generally passive sensors with desirable attributes for several types of applications that include insensitivity to weather conditions, the requirement of only a small bandwidth, and the unique ability to "see through" walls and foliage without attenuation. Furthermore, in military applications it is generally difficult to make a weapon or vehicle that does not include ferrous material that can be detected by magnetic sensors. Though the permanent magnetic moment of the ferrous material can be minimized by "deperming," which is a process of reduction of permanent magnetism, the distortion of the earth's magnetic field due to the magnetic permeability is typically difficult to hide. Data from magnetic sensors can be combined with the data from other sensor modalities such as acoustic and seismic sensors to characterize or identify and track targets. Specifically, in military applications magnetic sensors can be used for perimeter defense, at check points, as part of a suite of sensors in unattended ground sensor networks, and on unmanned ground vehicles (UGVs) and unmanned air vehicles (UAVs). Moreover, magnetic sensors or transducers can also be employed to monitor rooms and passageways that have been cleared by military personnel.

The magnetic signals from military targets come from the internal motion of ferromagnetic parts, electrical currents, and the motion of targets containing ferromagnetic material relative to the magnetic sensor. The latter can arise either from the motion of the target or the sensor. All of these magnetic signals often occur at low frequencies, typically less than 100 Hz. Because the earth's field is usually larger than the field generated by the target, it is generally difficult to detect the magnetic signals that occur at low frequencies, typically less than 100 Hz. Moreover, it is generally difficult to detect the magnetic target without having the field change by relative motion between the target and the sensor. At low frequencies the electric and magnetic fields are decoupled. The magnetic strength from a target at a distance greater than the target size is usually like that of a magnet dipole. Because of the relatively short detection range of magnetic sensors, a large number of magnetic sensors may have to be used if one wants to guarantee detection over a large area.

Magnetoresistance sensors are candidate low cost sensors because they can be mass produced by batch processing on silicon wafers and the drive and read out electronics are relatively simple. The resistance of a magnetoresistance sensor is sensitive to the magnitude and direction of the magnetic field. The types of magnetoresistive sensors include anisotropic magnetoresistance (AMR) sensors, giant magnetoresistance (GMR) sensors, and magnetic tunneling junction (MTJ) sensors. Magnetoresistance values as large as 220% may be observed in CoFe(100)/MgO(100)/CoFe(100) MTJ sensors at room temperature.

To detect the relative motion between the target and the magnetic sensor generally requires high sensitivity in the frequency range $f \leq 1$ Hz. Unfortunately, most magnetoresistance sensors tend to suffer from 1/f noise. Furthermore, there is generally a tendency for the sensors that have a larger response to magnetic fields to also have more 1/f noise. Thus, 1/f noise is a significant problem in applying magnetic sensors to military applications.

Another problem in using magnetoresistive sensors at low frequencies and at low fields is that the induced percentage change in the resistance is generally small. Thus, with a single device one must accurately measure a small change in a large signal. Because of this problem, most magnetoresistive sensors have several sensors that are arranged in bridge circuits to eliminate the DC bias offset.

Anisotropic magnetoresistance (AMR) sensors are probably the most sensitive, commercial, magnetoresistance sensors to use at frequencies of 1 Hz or less. This is true despite the fact that their magnetoresistance, approximately 4%, is relatively small. The reason for this is that AMR sensors have less 1/f noise than other magnetoresistive sensors. However, there remains a need for a device that can eliminate the problem of 1/f noise in small magnetic sensors.

When measuring magnetic flux, it is generally advisable to increase the input dimensions of the concentrator in order to provide for greater detection capability. In flux concentrators which move or oscillate, increasing the dimensions generally translates to an increase in mass. For example, U.S. Pat. No. 6,670,809 describes an approach that, improves the sensitivity of magnetic sensors in general that operate at low frequencies by using flux concentrators that modulate an observed sensed magnetic field with low frequency signals, thereby shifting this observed field to higher frequencies where the 1/f noise of the sensor is smaller. This is accomplished by providing a magnetic flux concentrator deposited on suspended microelectromechanical system (MEMS) structure. Such a combined device is used in a magnetometer.

The moving flux concentrators are utilized to periodically increase the sensed magnetic flux density at the position of the sensor 10. A layered material forming part of the flux concentrator 40 can comprise a thick film of a soft ferromagnetic material with a large magnetic permeability.

There are several types of magnetometers (magnetic sensors with external instrumentation) currently used. The least expensive and least sensitive devices have resolution of about $10^{-1}$ Oersted (Oe)/Hz$^{1/2}$ and typically are Hall effect devices. These devices work by sensing a voltage change across a conductor or semiconductor placed in a magnetic field. Such devices do not lend themselves for applications requiring greater sensitivity, such as that required in brain scan devices and magnetic anomaly detection devices. Flux gate magnetometers are more sensitive, having resolution of approximately $10^{-6}$ Oe/Hz$^{1/2}$. Flux gate magnetometers use a magnetic core surrounded by an electromagnetic coil and are difficult to microfabricate. Additionally flux gate magnetometers require relatively large amount of power and accordingly do not lend themselves to low-cost, compact, portable design. The most sensitive magnetometers called SQUIDS (superconducting quantum interference devices) have a resolution of about $10^{-10}$ Oe/Hz$^{1/2}$. However, because they include a superconducting element, these apparatus must include cooling means at liquid gas temperatures, making them extremely bulky and expensive to operate. Their size limits their utility because the active superconducting element cannot be placed directly adjacent to the source of the magnetic field, for example the brain. Accordingly, there is need for small, inexpensive, low power magnetometers that have sufficient sensitivity to be useful for a variety of magnetometer applications at low frequencies. Magnetoresistive sensors are suited for low-cost, medium-sensitivity application.

A well known way of increasing the sensed magnetic field by a magnetic sensor is by use of a flux concentrator, which can enhance a sensed magnetic field by as much as a factor of 50. An example of such a device is taught in U.S. Pat. No. 5,942,895, entitled "Magnetic field sensor and current and/or energy sensor," that use Hall sensors with flux concentrator components.

Magnetic sensors used to detect objects that move slowly typically possess considerable low frequency 1/f-type noise, an unwanted condition. In general, there is a tendency for such devices that have higher sensitivity to also exhibit higher 1/f-type noise. This generally occurs when using magnetoresistive-type magnetic sensors, as reported in van de Veerdonk et al., "1/f Noise in Anisotropic and Giant Magnetoresistive Elements," J. Appl. Phys. 82, 6152 (1997).

A magnetic sensor (magnetometer) that addresses 1/f-type noise is taught in U.S. Pat. No. 4,864,237. This disclosure teaches of an apparatus for measuring magnetic fields, that change only at extremely low frequencies. The apparatus uses a SQUID magnetometer that includes a superconducting flux transformer that inductively couples a detected signal into a d-c SQUID sensor. This magnetometer can optionally include a device for modulating the detected signal in a frequency range characteristic of low-noise operation of the SQUID. The modulation frequencies are generally above 1 Hz and optionally even above 1-kHz. Limitations of this device include need for cryogenic operation, which inherently do not lend themselves to relatively lost cost, low power use.

Thus, there is need, for small, low-cost, low-power-consuming magnetic sensors having sensitivities capable of meeting the varied applications listed above for detecting low frequency signals and minimize 1/f-type noise. There exists a need for a magnetic sensor with flux concentrator having sufficient sensitivity for a variety of applications that minimize the effects of 1/f-type noise. There exists a need for a magnetic sensor with flux concentrator that is inexpensive to manufacture, having a magnetic sensor having high sensitivity, yet not having to be concerned with 1/f-type noise associated with that type of sensor. There also exists a need for increased input dimensions of the concentrator in order to provide for greater detection capability.

SUMMARY OF THE INVENTION

Construction of a larger MEMS flux concentrator having the ability to respond to higher frequencies is somewhat problematic because increasing the size of the flux concentrator generally increases the mass, which leads to a decrease in the resonant frequency. A high resonant frequency is desirable in order to operate at higher frequencies where 1/f noise is small. By using at least one supplemental flux concentrator whose mass is independent of at least one movable flux concentrator, the overall mass of the flux concentrators may be increased providing an enhanced magnetic fluid without affecting the frequency of the at least one movable flux concentrator. The present invention also incorporates vacuum packaging to reduce frictional resistance imparted by the air. A preferred embodiment of the present invention provides a magnetic sensor assembly with an extended or supplemental flux concentrator that enhances the input of flux. A preferred embodiment assembly can be produced, for example, by microfabrication MEMS-techniques, producing a small and inexpensive yet extremely sensitive magnetic sensor. Improved sensitivity of magnetic sensors operating at low frequencies is achieved by using flux concentrators that modulate an observed or sensed magnetic field, thereby shifting this observed field to higher frequencies where the noise of the sensor is smaller to minimize 1/f-type noise. This is accomplished by providing a microelectromechanical systems (MEMS)-type magnetic flux concentrator in combination with a magnetic sensor. The magnetic sensor can be a Hall effect or other type of magnetic sensor. The MEMS flux concentrators 40 may be composed of a soft magnetic material, such as permalloy, deposited on MEMS structures.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The foregoing and other objects, features, and advantages of the invention will be apparent from the following more detailed description of the preferred embodiments of the invention, as illustrated in the accompanying drawings, wherein:

FIG. 8A is an illustration showing the Tesla sensitivities required for various applications involving magnetic sensing.

FIG. 8B is an illustration showing a comparison of the operative techniques of vector magnetometers versus total field magnetic sensors.

FIG. 9 is a graphical illustration of "magnetic noise" from various weapons and vehicles showing the magnetic anomaly signal versus the range in meters.

FIG. 13 is a diagram of the lines of flux from an applied field as they are concentrated by the flux concentrator 40.

FIG. 16 is a diagrammatic presentation of an embodiment of a portion of the present invention mounted on a wafer wherein the dimensions are magnified over 10 times.

FIG. 17A is a view of the MEMS structure in motion.

FIG. 17B is the frequency dependence of the amplitude of the device showing the two in-plane normal modes.

FIG. 19 illustrates an alternative embodiment of the present invention having a movable alternate flux path comprising soft magnets 48 supported by spring(s) 50S.

FIG. 20 illustrates an alternative embodiment of the present invention having a movable alternate flux path comprising soft magnets 48 supported by a lever subassembly 54.

Figure 1:
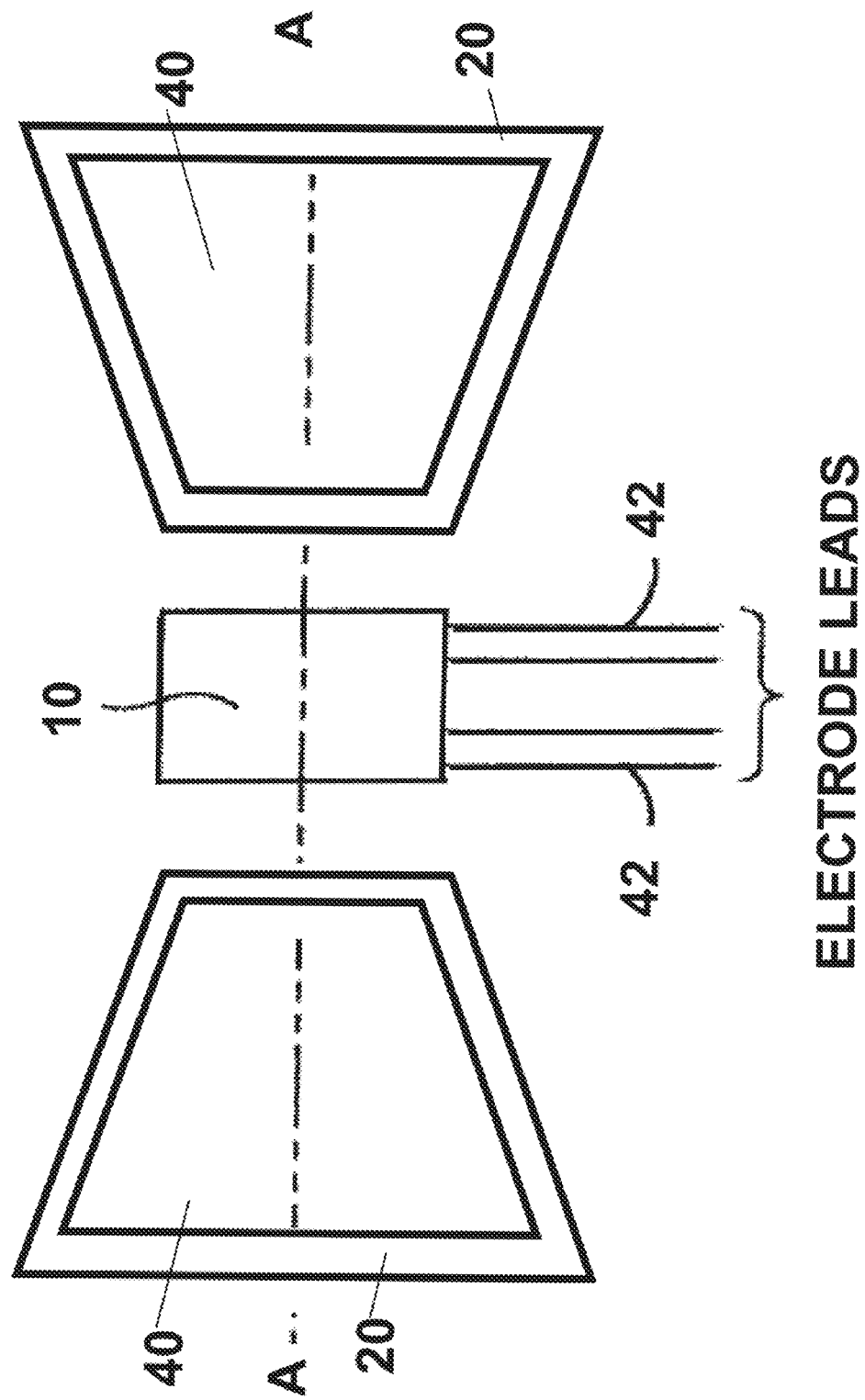
FIG. 1 is an overhead view of a magnetic flux concentrator design concentrator in combination with a magnetic sensor using MEMS fabrication.

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DESCRIPTION OF THE PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second photons in a photon pair, these terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Figure 2:
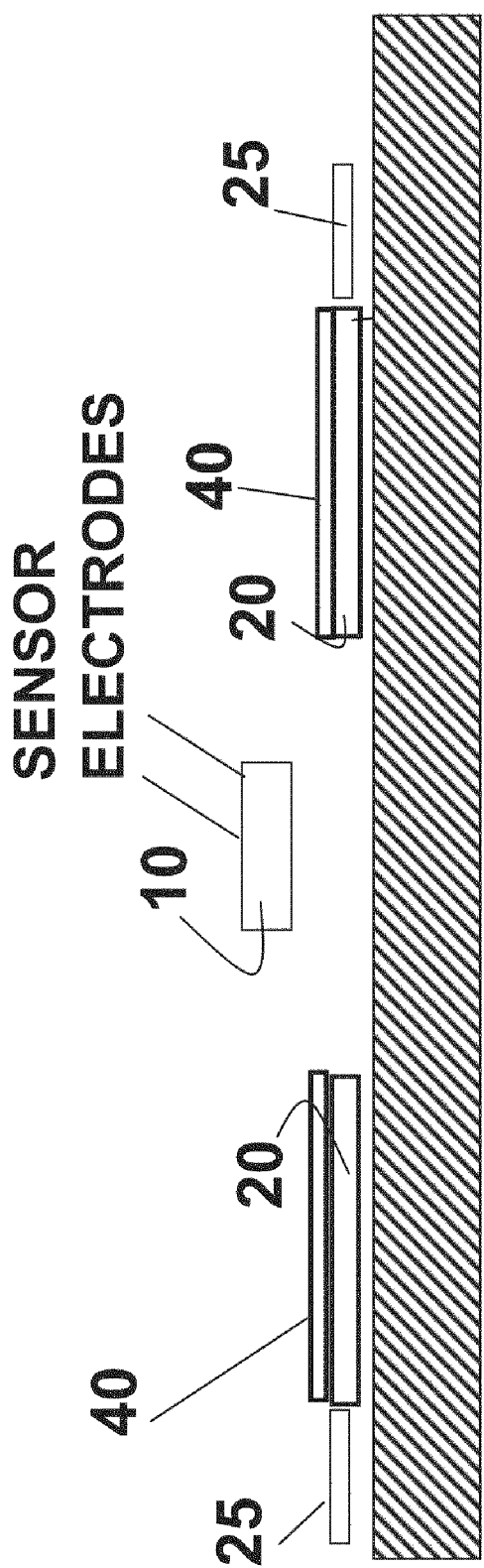
FIG. 2 is a side view of a magnetic flux concentrator design of FIG. 1 in cross-section along line A-A.
Figure 10A:
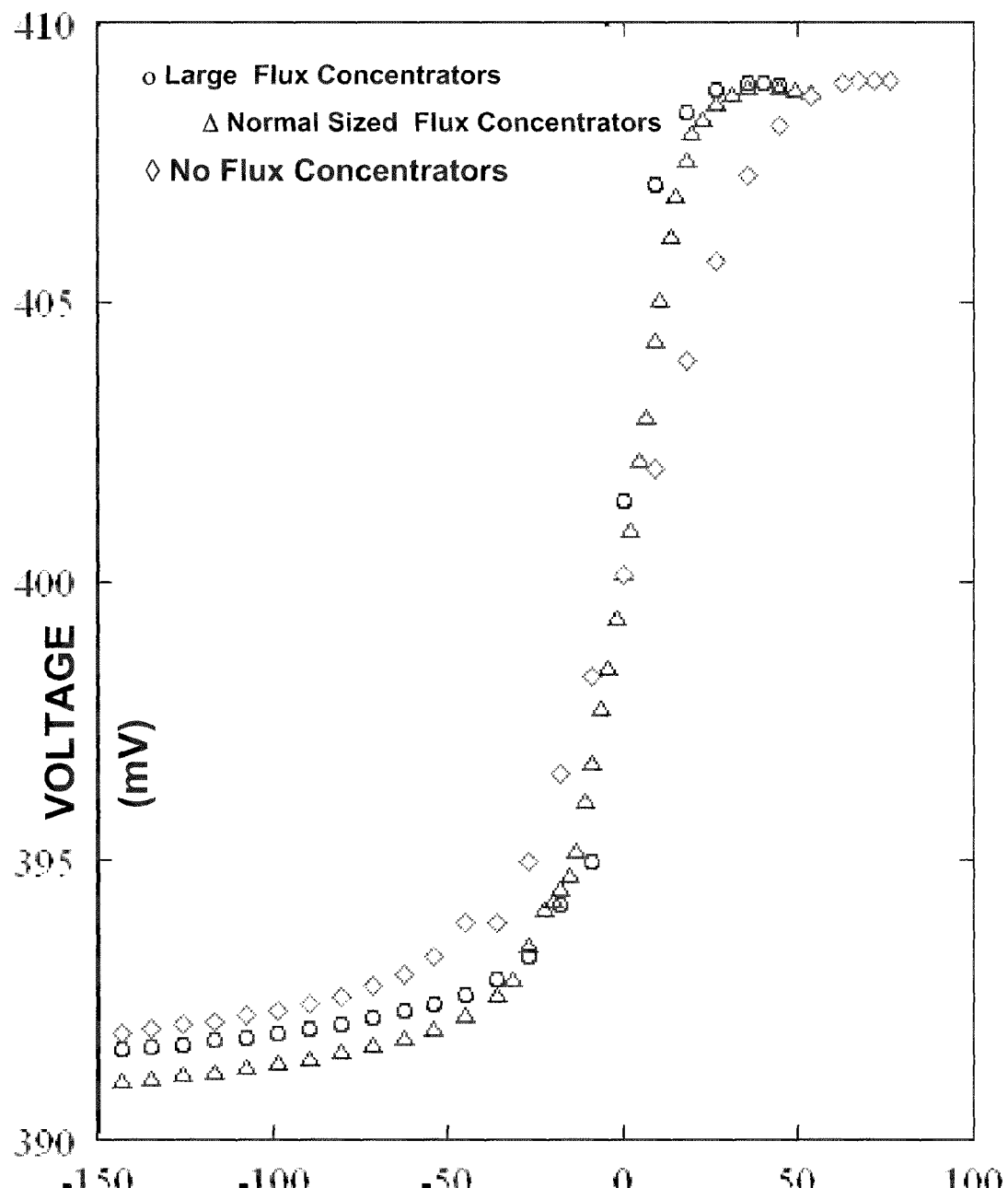
FIG. 10A illustrates graphical representations of the voltage versus magnetic field showing potential enhancement using flux concentrators.
Figure 10B:
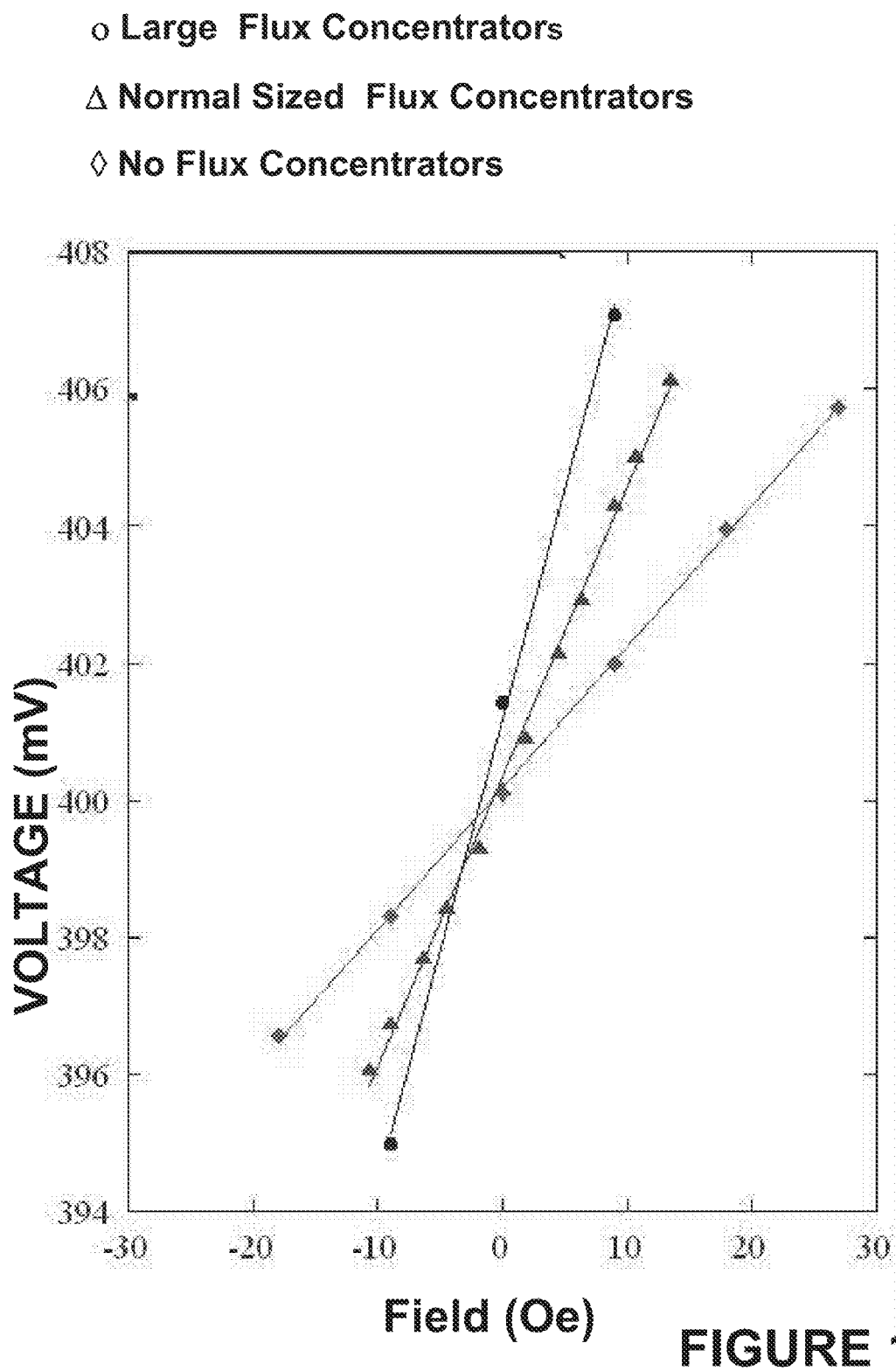
FIG. 10B illustrates graphical representations of the voltage versus magnetic field showing potential enhancement using flux concentrators showing an enhanced view of a portion of FIG. 10A.
Figure 11:
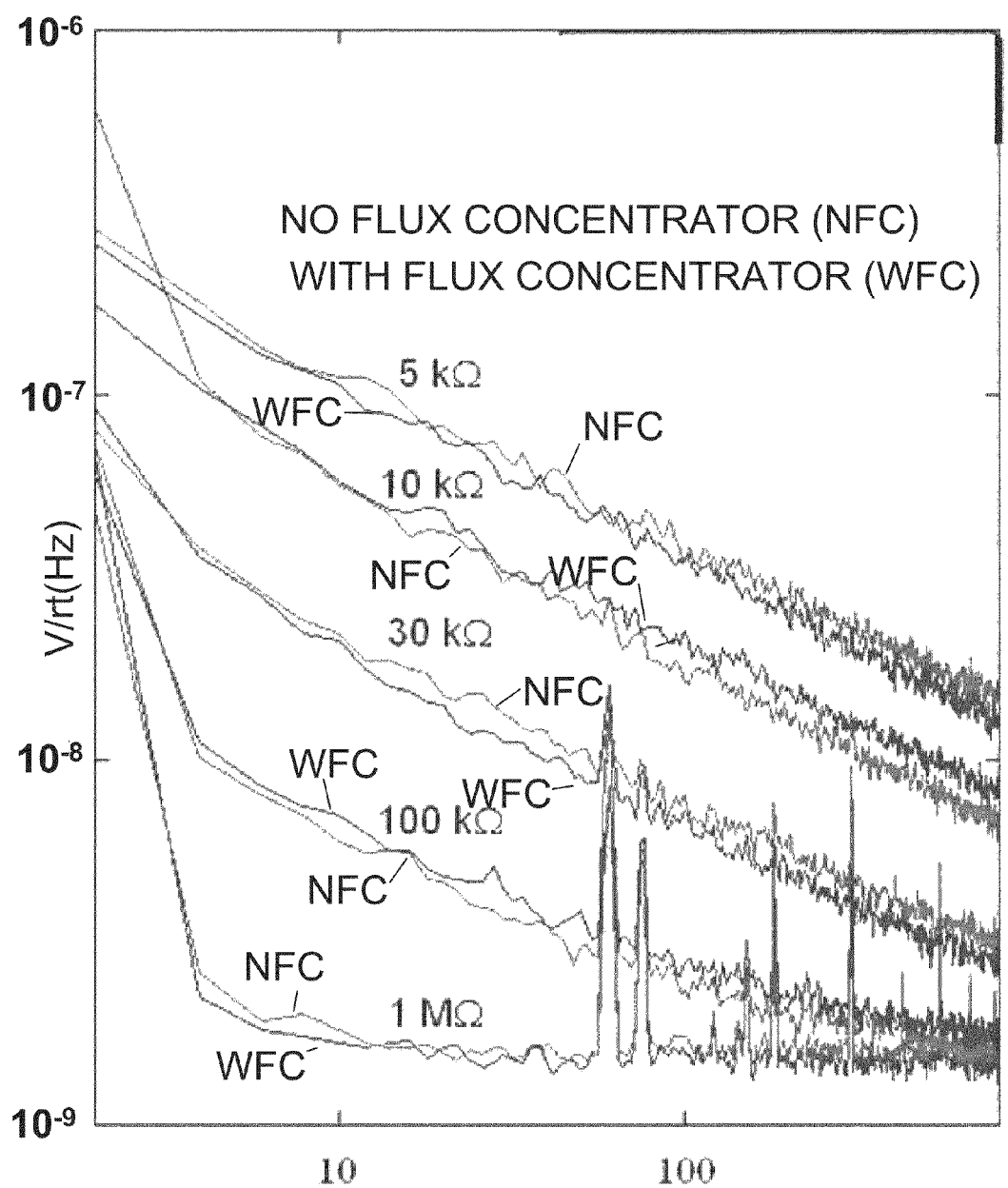
FIG. 11 is a graphical representation illustrating that the use of flux concentrators does not substantially impact the magnetic sensing.
Figure 12A:
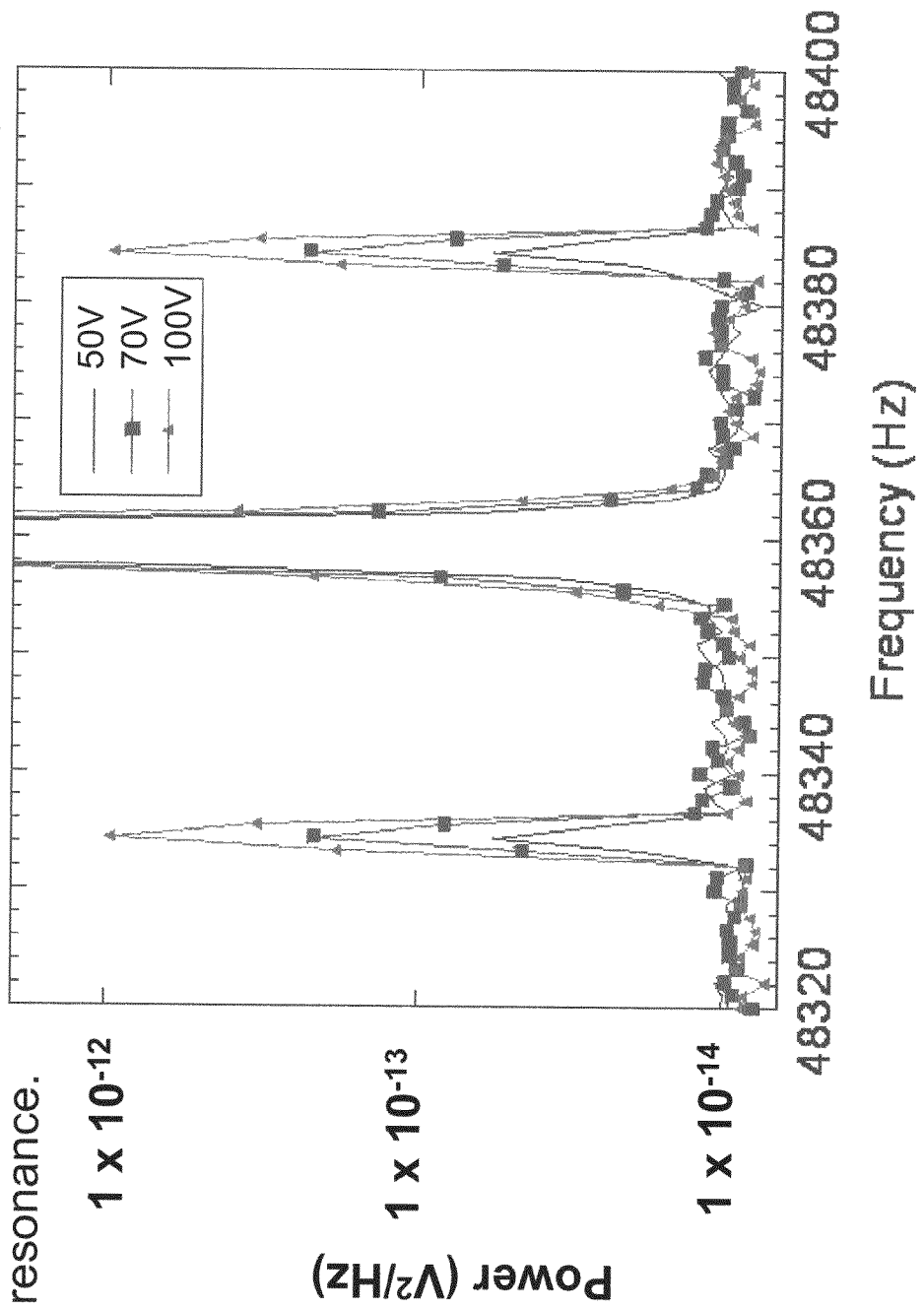
FIG. 12A is a graphical illustration showing the operations of flux concentrators at resonant frequency.
Figure 12B:
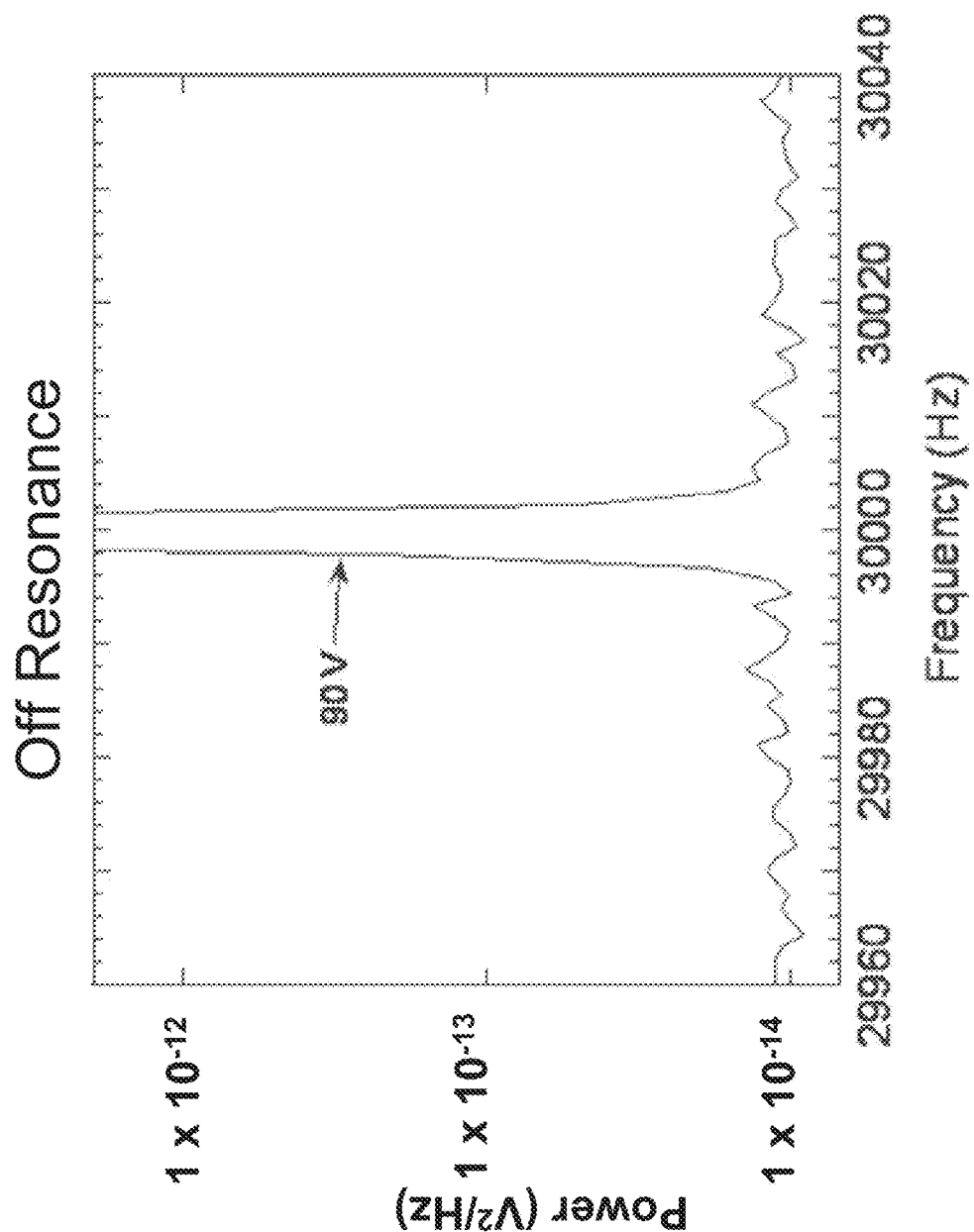
FIG. 12B is a graphical illustration showing the operations of flux concentrators off resonant frequency.

Referring to FIGS. 1 and 2, a subassembly is shown that includes a magnetic sensor 10 with two flux concentrators 40. Each flux concentrator 40 increases the sensed magnetic flux density at the position of the sensor 10. A layered material forming part of the flux concentrator 40 can comprise a thick film of a soft ferromagnetic material with a large magnetic permeability. FIG. 13 illustrates the lines of flux within the flux concentrators 40, and in the region near the flux concentrator. FIG. 10 illustrates graphically the enhancement of the field using flux concentrators.

The flux concentrators 40 enhance the field at the position of the magnetic sensor 10. Decreasing the separation between the MEMS structures increases the enhancement. At least one (or two) MEMS flux concentrator is forced to oscillate by applying a power source, such as an ac voltage, to a drive, such as an electrostatic comb drives. Because the teeth of the comb are pulled together independently of the sign of the applied voltage, the field at the sensor is modulated at twice the frequency of the applied drive voltage. By tuning the frequency, one can excite the normal mode in which the distance between the MEMS structures oscillates. This is the out-of-phase mode shown in FIG. 17B. One can also vary the frequency in which the position of the entire MEMS structure oscillates, this is the in-phase mode shown in FIG. 17B. The resonant frequency for the MEMS structure may, for example, be about 10 kHz. The size of the flux concentrators 40B may be limited by the need to keep the resonant frequency of the flux concentrators 40B, comb drives 11, and springs 46S, 46A in the range of several kHz or higher. The values for the enhancement provided by the flux concentrators 40B are calculated when the separation between the MEMS flux concentrators 40B is at their planned maximum and minimum displacements. These values may be approximately 1.5 and 3.5, respectively.

The oscillation of the MEMS flux concentrators modulates the field at the position of the sensor and, hence, shifts the operating frequency of the sensor above the frequency where 1/f noise dominates. Depending on the type of magnetic sensor used, this shift in operating frequency can preferably increase the sensitivity of magnetometers at 1 Hz by one to three orders of magnitude. The MEMS structures may be connected to one another and to the body of the sensor by silicon springs so that there is an in-plane normal mode for the motion in which the separation between the MEMS flux concentrators is oscillatory. The effectiveness of spin-valve sensors may be enhanced because they have a considerable amount of 1/f noise.

In a preferred form, the sensor 10 comprises films deposited on a silicon substrate. As shown in FIG. 1, the flux concentrators 40 are deposited on silicon MEMS structures 20. Modulation of a sensed magnetic signal at the magnetic sensor 10 is accomplished by suspended flux concentrator members 40 so that they move relative to the magnetic sensor or transducer 10. The silicon MEMS structures 20 are formed using microelectromechanical system (MEMS) fabrication techniques.

In the magnetometer, the flux concentrators 40 on the silicon MEMS structures 20 are driven electrostatically to move at modulating frequency $f_m$. In the in-phase mode, when one of the concentrators 40 is at a position closest to the transducer 10, the sensed magnetic flux is concentrated at the magnetic sensor 10. In operation, when the flux concentrators 40 are moved back and forth, the concentrated magnetic field is modulated vis-à-vis the transducer 10.

FIG. 2 is a cross-section along line A—A of FIG. 1. FIG. 2 shows a magnetic field sensor or transducer 10, which preferably uses a Hall effect device or a magnetoresistive type magnetic sensor, and two magnetic flux concentrators 40 for strengthening a magnetic field at the position of the sensor 10 in the direction B. The dimensions of the flux concentrators 40 in FIG. 1 typically encompass gross dimensions of 100 by 75 microns, while the thickness of the concentrators is typically around 0.1 to 15 micrometers.

Driving the motion from the signal generator requires very little power. This is especially true if the drive frequency is set equal to the mechanical resonant frequency of the suspended structures 20 containing the flux concentrators 40. By using the resonant frequency, one obtains the largest amplitudes for the oscillations using the least power. The magnetic field generated by the small currents of the exciting electrostatic modulating signal is negligible.

The magnetic sensor 10 as shown, can be a Hall-effect device wherein four electrical leads 42 (identified as "electrode leads to magnetic sensor" in FIG. 1) are required. Other types of Hall effect devices, which typically have a rectangular geometry with current or voltage electrodes arranged on each side of a rectangle, may also be used. It is also possible to use Hall devices in which three or all four electrodes are arranged on one side of the rectangle, see U.S. Pat. No. 5,057,890. When a Hall effect device is used, an output voltage from such a device results from the Lorentz force of the magnetic field acting on charge carriers within such a device. Other types of magnetic sensors that can be used other than Hall effect devices include flux gate magnetometers and magnetoresistive sensors that include anisotropic magnetoresistive sensors, giant magnetoresistive sensors, spin dependent tunneling sensors, and bismuth, magnetostrictive sensors, and MEMS sensors.

When the magnetic sensor 10 is a magnetoresistive element, a Wheatstone electrical bridge configuration is typically used. When the resistance of the magnetoresistive element changes because of a magnetic field, the bridge output voltage changes. The change in the bridge output is increased by using the flux concentrator. The bridge output voltage is modulated at a frequency $f_m$, typically the resonant frequency of the suspended silicon MEMS structures 20, by the motion of the MEMS flux concentrators 40. The signal can then be amplified by a narrow band amplifier and then demodulated. The bandwidth of the amplifier only has to be broad enough to include the low frequencies in the original signal coming into the MEMS flux concentrator.

Figure 4:
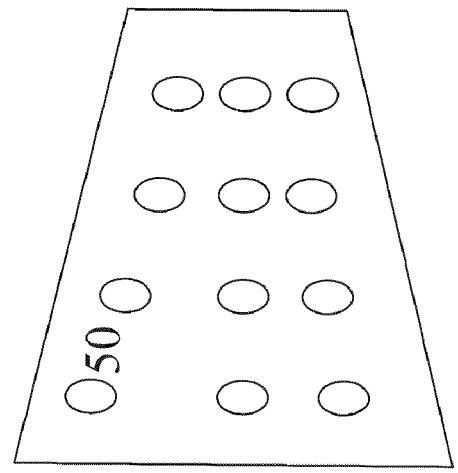
FIG. 4 is a schematic view of a flux concentrator design employing oval release holes.

In one form the flux concentrator 40 (FIGS. 1 and 2), 40B (FIGS. 5-7) or 40C (FIGS. 5-7) comprises a single layer of a soft ferromagnetic material. There are several other alternatives. FIG. 4 is a plan view of one of the MEMS structures 20 having release holes 50.

The flux concentrators 40, 40B and 40C can be constructed in multiple layers: these layers comprise a hard magnetic material (having a coercivity greater than 50 Oersteds) layer and a soft magnetic material (having a coercivity less than 3 Oersteds) layer with equal magnitude magnetizations separated by a spacer layer, as described in more detail in U.S. Pat. No. 6,670,809, hereby incorporated by reference. The spacer layer is a nonmagnetic material, such as aluminum or silicon dioxide the thicknesses of the layers may be, for example, about one micron. In zero applied field, the magnetizations of both the hard material and the soft material should be perpendicular to the field measuring direction B and directed opposite to one another. Thus, in the absence of an applied field, the fields due to the soft and hard material should approximately cancel one another at the position of the sensor.

A design can be used wherein the edges of the flux concentrators 40 are modified to decrease the magnetic noise. This can be done by treating the edges of the soft magnetic material of the flux concentrators 40, 40B and 40C so that they have slightly higher coercivity than the center. This improves the magnetic response. The rest of the flux concentrator preferably includes a similar three-layer structure with similar arrangement of the magnetizations as described above. The directions of the magnetization can be obtained by processing the flux concentrator in a magnetic field. This overall geometry maximizes the response of the flux concentrator to a field that is applied in the field measuring direction B.

The invention may be fabricated by MEMS processing techniques. Such techniques are addressed by LIGA (Lithographie, Galvanoformung, Abformung, for "lithography, electroplating molding") micromachining processing methods that use metals, polymers and even ceramics for the production of varied microstructured devices having extreme precision. These collective microstructures are referred to as MEMS-type devices that are alternatives to conventional discrete electromechanical devices such as relays, actuators, and sensors. When properly designed, MEMS-type devices produce useful forces and displacement, while consuming reasonable amounts of power.

Current LIGA processes create features whose top surface is as much as 200-microns above the substrate. Any technology may be used to form the device, whether a LIGA-type process or a bulk plasma micromachining technique such as RIE (reactive ion etching), or a surface micromachining technique using standard photolithography and etching processes yielding the desired configurations. Preferably each flux concentrator 40, 40B is fabricated on a die that in an extreme case might be as large as one square centimeter, but is more likely to be less than one square millimeter in area and about 0.5 to 50 microns thick.

As mentioned above, each device may be implemented on a single silicon chip or die, but multiple dies also can be used. In a preferred embodiment of the invention, the device is monolithic in its basic configuration. MEMS devices can be readily integrated and interfaced with electronics because they are fabricated much the same way as integrated circuits. The specific MEMS fabrication technique requires only that desired geometries and mechanical and electrical performance characteristics are obtained. The preferred processing steps are as follows and illustrated in U.S. Pat. No. 6,670,809.

In operation, the MEMS flux concentrators 40, 40B are driven by an electrostatic comb drive. The amplitude of the reciprocation movement is proportional to $V^2$ where V is the applied voltage. The amplitude of the oscillating motion is obtained by differentiating equation (1) with respect to the overlap to obtain the force.

$$\text{Energy} = \frac{\varepsilon_0 \cdot (n-1) \cdot \text{overlap} \cdot \text{thickness} \cdot V^2}{2d} \quad (1)$$

where n is the number of teeth in the comb drive and d is the separation between the teeth INCREASING THE Q FACTOR. The Q factor is proportional to the width of the resonance divided by the frequency. To minimize the voltage that must be applied to obtain a sufficient amplitude it is desirable to have a high energy factor. The major limiting factor is air resistance. Air resistance can be minimized either by vacuum packaging the device (as shown in FIG. 3).

Figure 3:
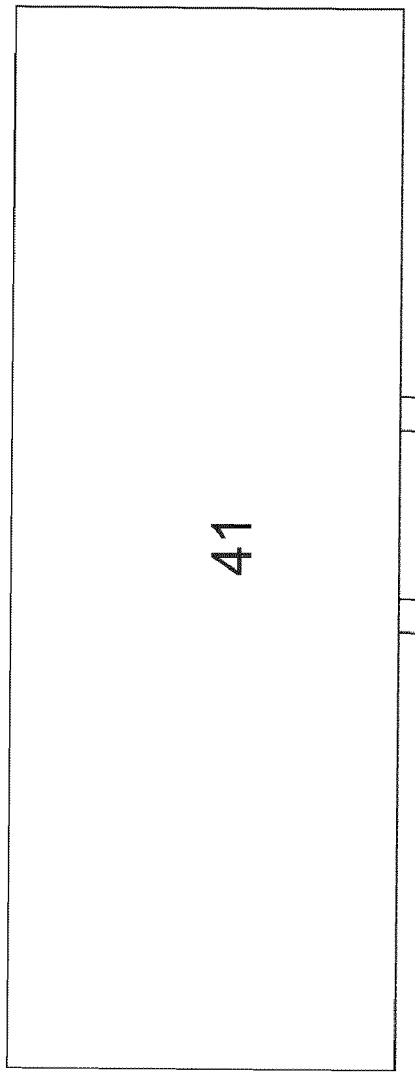
FIG. 3 is a diagrammatic illustration of a vacuum chamber for the MEMS of the present invention, such as the device of FIGS. 1 and 2.

FIG. 3 shows a plan view of a container 41 for the device of FIGS. 1, 2, 5, 6 and 7. The container 41 is a vacuum package which contains the device of FIG. 1 therein. The electrical leads 42 for the magnetic sensor 10 and the leads for the electrodes 15, 25 pass through airtight seals in the container 41. Methods for vacuum packaging are known in the art.

Figure 22:
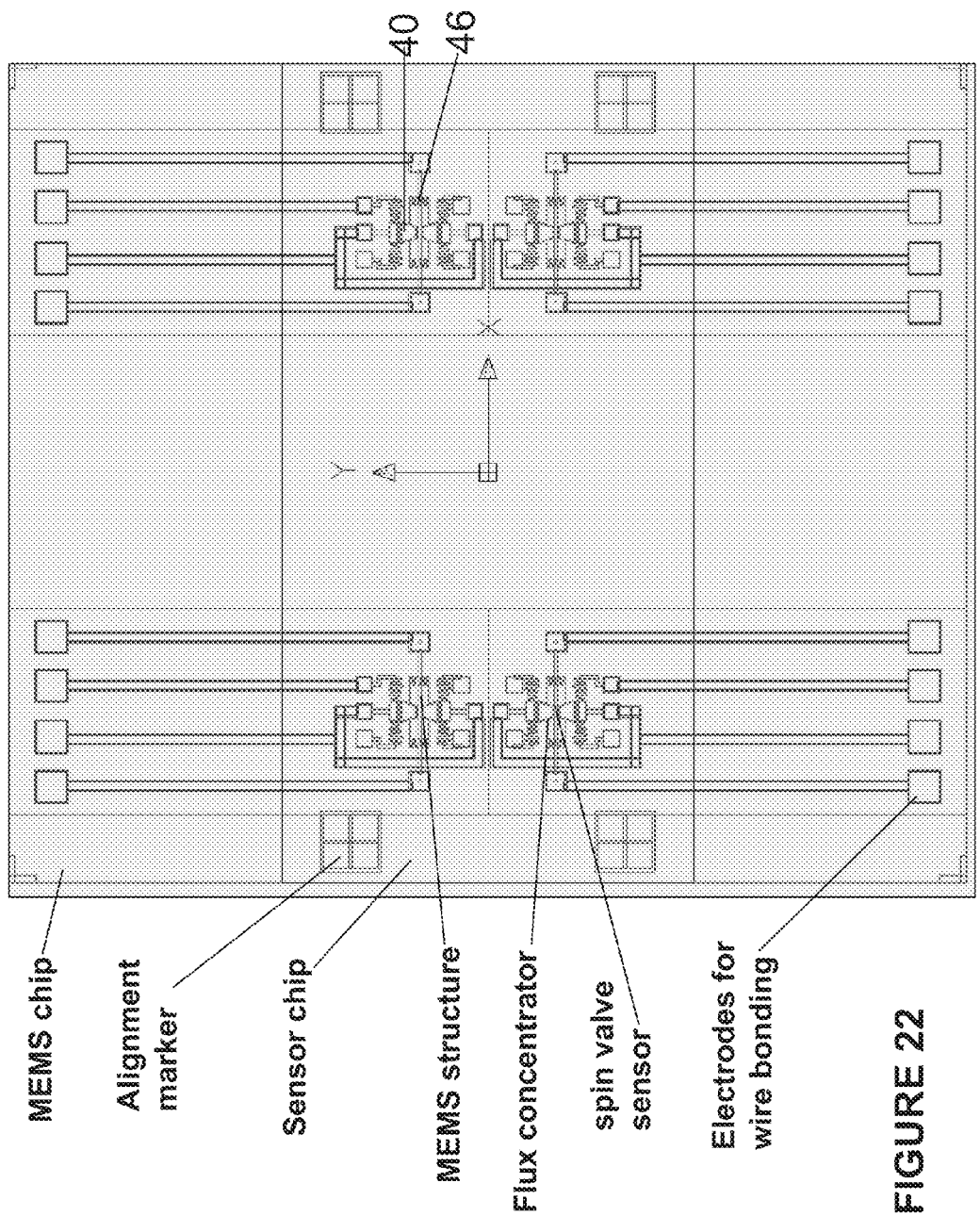
FIG. 22 illustrates the design of a wafer having a plurality of MEMs devices mounted thereon.

As discussed in U.S. Pat. No. 6,670,809, it is important to minimize the 1/f noise of the flux concentrator 40, 40B. The MEMS structures 20 in FIG. 1 may be coated with a soft magnetic material. The 1/f noise may be minimized if the magnetization changes by domain rotation. The magnetization can be forced to change by domain rotation by coating the magnetic material onto the MEMS structures in a special way The technology of the present invention may be used in embodiments where two or more MEMS devices, one of which is shown for example in FIGS. 5 and 6, may be utilized in parallel in a variety of geometrical configurations. FIG. 22 shows a plurality of MEMS structures fabricated on a sensor or MEMS chip.

Figure 5:
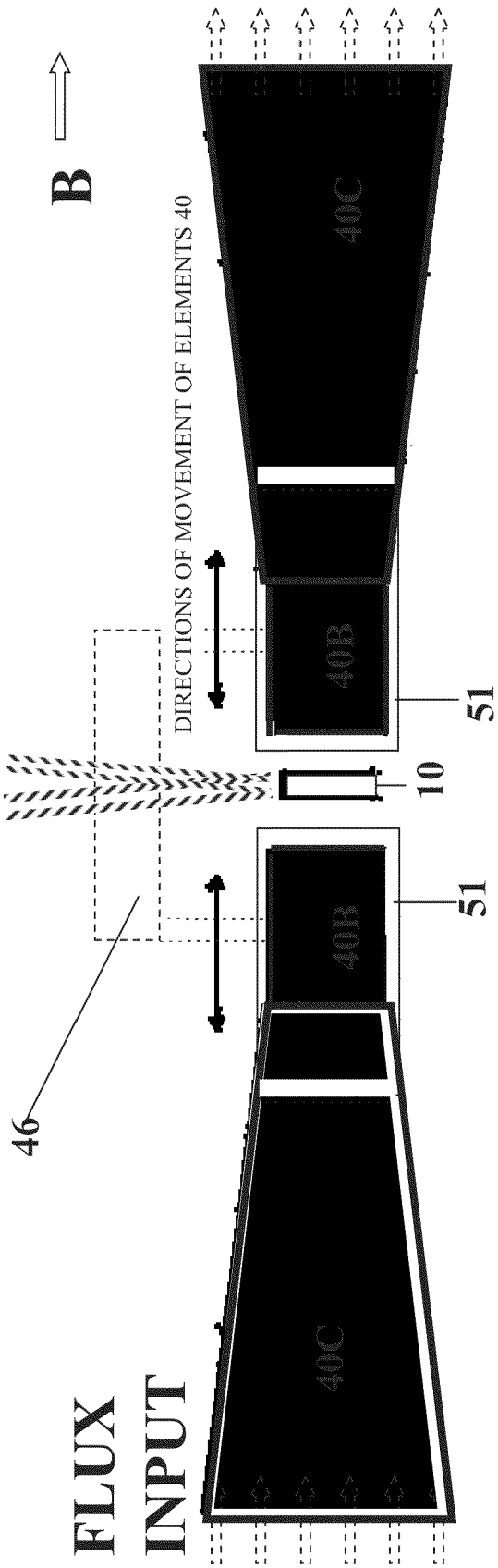
FIG. 5 is a plan view of a preferred embodiment of the present invention incorporating movable flux concentrators 40b and extension or supplemental flux concentrators 40C forming a compound assembly.
Figure 6:
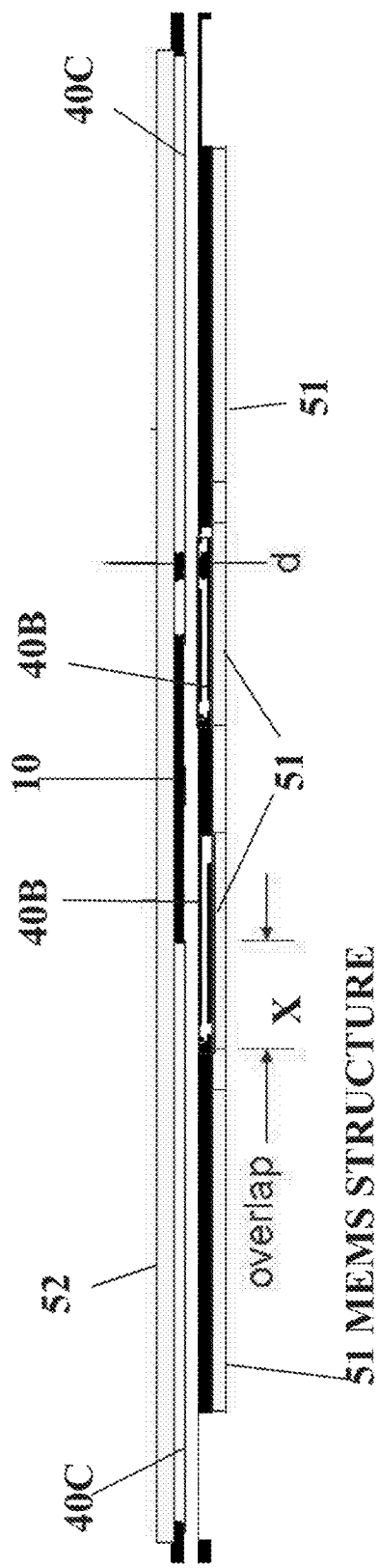
FIG. 6 is a side view the preferred embodiment of FIG. 5.

As shown in FIGS. 5 and 6, a preferred embodiment of the present invention enables the maintaining of a high resonant frequency while incorporating a large flux concentrator design.

Figure 7:
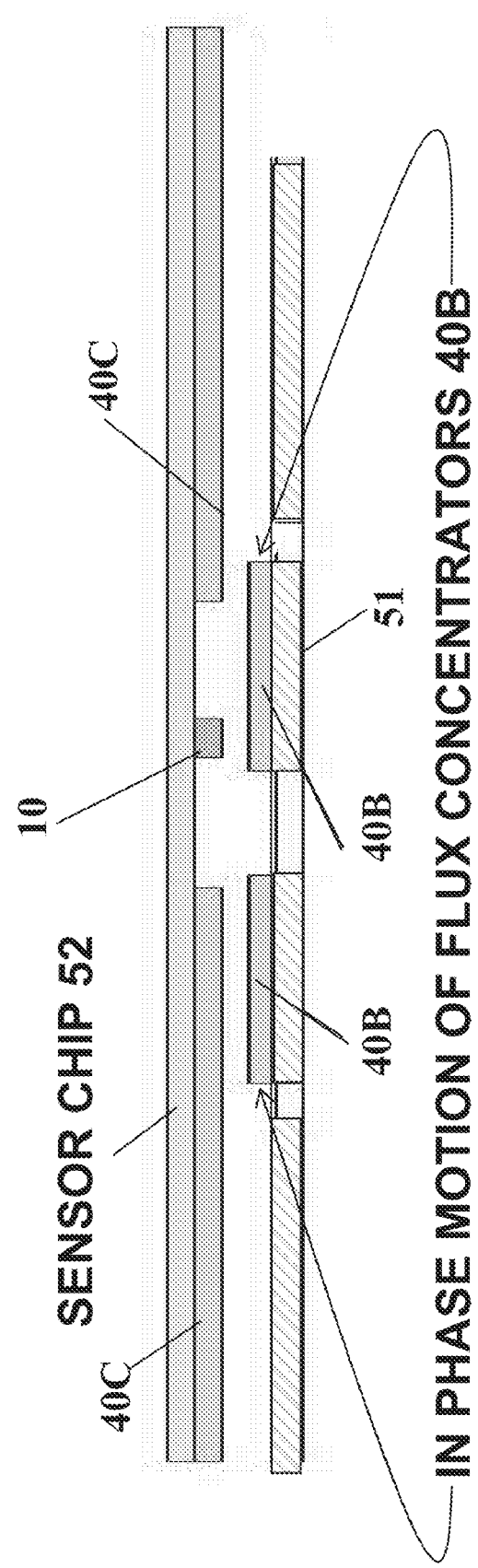
FIG. 7 is a schematic diagram of a MEMS device according to a preferred embodiment of the present invention with "in phase" motion of flux concentrators.
Figure 8C:
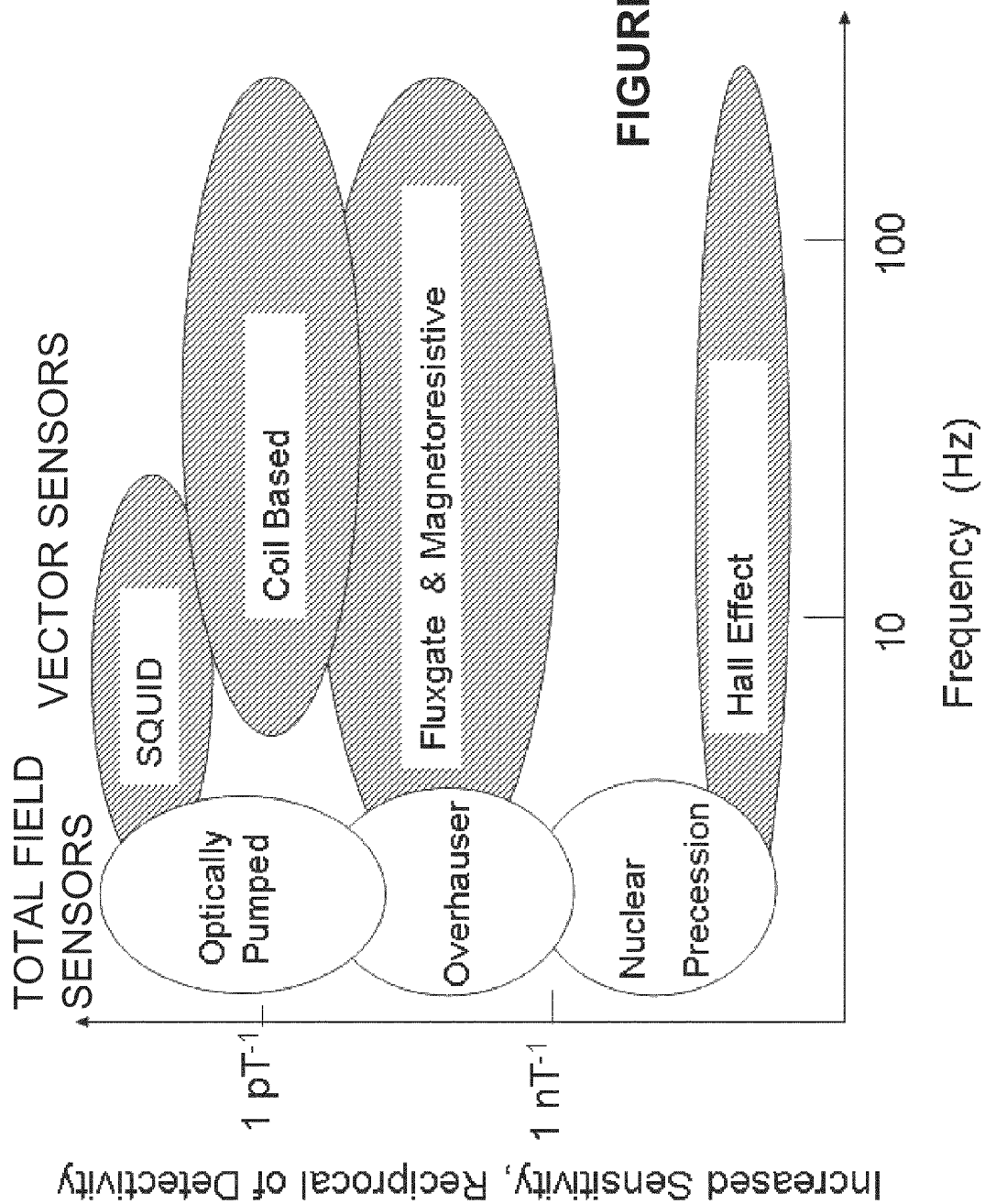
FIG. 8C is a graphical comparison between the vector and total field magnetometers, with the frequency range plotted against Tesla sensitivity and illustrating the problems associated with the total field and vector magnetometers.
Figure 9A:
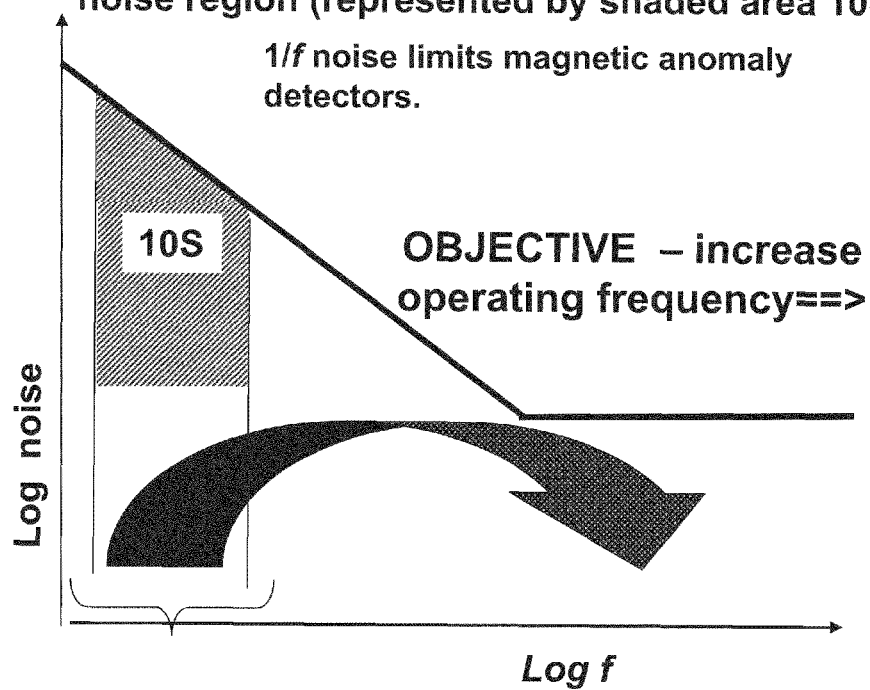
FIG. 9A is a graphical representation demonstrating the advantage achieved by modulating the transducer signal to eliminate 1/f noise.

A preferred embodiment of the present invention may operate in two modes. The first mode is when the flux concentrators 40B move out of phase. The motion of the flux concentrators 40B is out of phase in the sense that the separation between the MEMS structures oscillates in time. The magnetic field at the position of the sensor increases and decreases depending upon the separation. In the second mode, as shown in FIG. 7, the motion of the flux concentrators 40B move in phase. The motion of the flux concentrators 40B is in phase in the sense that the separation between the MEMS structures stays constant in time. FIGS. 5 and 6 illustrate the time where the gap is centered at the sensor 10. Another position of the flux concentrators 40B is shown in FIG. 7. Using the technology of the present invention, Magnetoresistance Based Magnetometers have the potential to become sensitive to 2 pT (pico Tesla), cost less than $100, consume small amounts of energy (<1 mW) and operate at a large bandwidth (0.001 Hz<f>10 Meg Hz.

As illustrated in FIG. 5, the embodiments of the invention provide a MEMS device comprising pairs of MEMS flux concentrators 40B, 40C, positioned on opposite sides of a magnetic sensor 10. The microelectromechanical modulating magnetic sensor comprises a base; a magnetic transducer or sensor 10 associated with the base that provides an output in response to a magnetic field; and at least one movable flux concentrator 40B positioned to move relative to the magnetic transducer. The movable flux concentrator 40B has a region of maximum concentration of flux at a predetermined region associated with the positions of the at least one movable flux concentrator. In otherwords, if there are two flux concentrators, there will be a region of maximum flux concentration at a region located between the two flux concentrators 40B, generally central to the two flux concentrators. The embodiment of FIG. 5 further includes at least one flux collector positioned to collect flux for transfer onto at least one movable flux concentrator 40B. Support structure enables the movable flux concentrators 40B to move. The support structure may be a spring 46. The preferred embodiment further includes a power source for causing the movable flux concentrators 40B to move at a frequency within the predetermined frequency range. As the movable flux concentrators move back and forth from a first position to a second position the region of maximum concentration of flux moves relative to the transducer. The flux in the region of maximum concentration of flux may change due to the motion. As the flux concentrators 40B move, the output of the transducer 10 is modulated.

In the in-phase mode of a preferred embodiment, where two flux concentrators 40B are separated a fixed distance apart and translate rigidly, the flux concentrators 40B have a region of maximum flux in the region between the two movable flux concentrators. When the pair of movable flux concentrators is in a first position the region of maximum flux is in a first location, and when the pair of movable flux concentrators is in a second position, the region of maximum flux is in a second position. As the pair of flux concentrators 40B move in tandem, the location of the region of maximum flux concentration moves relative to the sensor or transducer 10. As the flux concentrators 40B move from the first position to the second position the intensity of the flux sensed by the transducer is modulated as the region of maxima approaches and recedes from the location of the transducer.

In the out-of-phase mode of a preferred embodiment, where two flux concentrators 40B no longer are separated a fixed distance apart. Instead they move toward and away from each other. The flux concentrators 40B have a region of maximum flux in the region between the two movable flux concentrators. However, in the out-of-phase mode, the location of the region of maximum flux concentration does not substantially change; but the intensity of the maximum flux changes. When the pair of movable flux concentrators is in a first position, such as a position where the pair of movable flux concentrators are a maximum distance apart, region of maximum flux intensity is at a minimum. As the flux concentrators 40B move to a point at which they are closest to each other, the region of maximum flux is at a maximum. Accordingly, as the flux concentrators 40B move from the first position to the second position the intensity of the flux sensed by the transducer is modulated as the intensity of the flux in the region of maximum flux increases and decreases.

Regarding the collector flux concentrator 40C, which may remain stationary relative to the movable flux concentrators 40B, the volume of each of the collector flux concentrators is generally greater than the movable flux concentrator 40B so that more flux lines are drawn in. This is effective in situations where there is a need to detect weaker fields, such as the magnetic field generated by the heart. The sensitivity is enhanced without affecting the weight of the movable flux concentrator 40B. There is sufficient overlap and close proximity between the collector flux concentrator(s) 40C and movable flux concentrators 40B so that collected flux is efficiently transferred to the moving flux concentrator 40B. Although not all of the flux may not be transfer due to fringing effects, the positioning in close proximity achieves a substantial transfer of flux so as to result in an increase in the overall flux sensing capacity overall.

Figure 23:
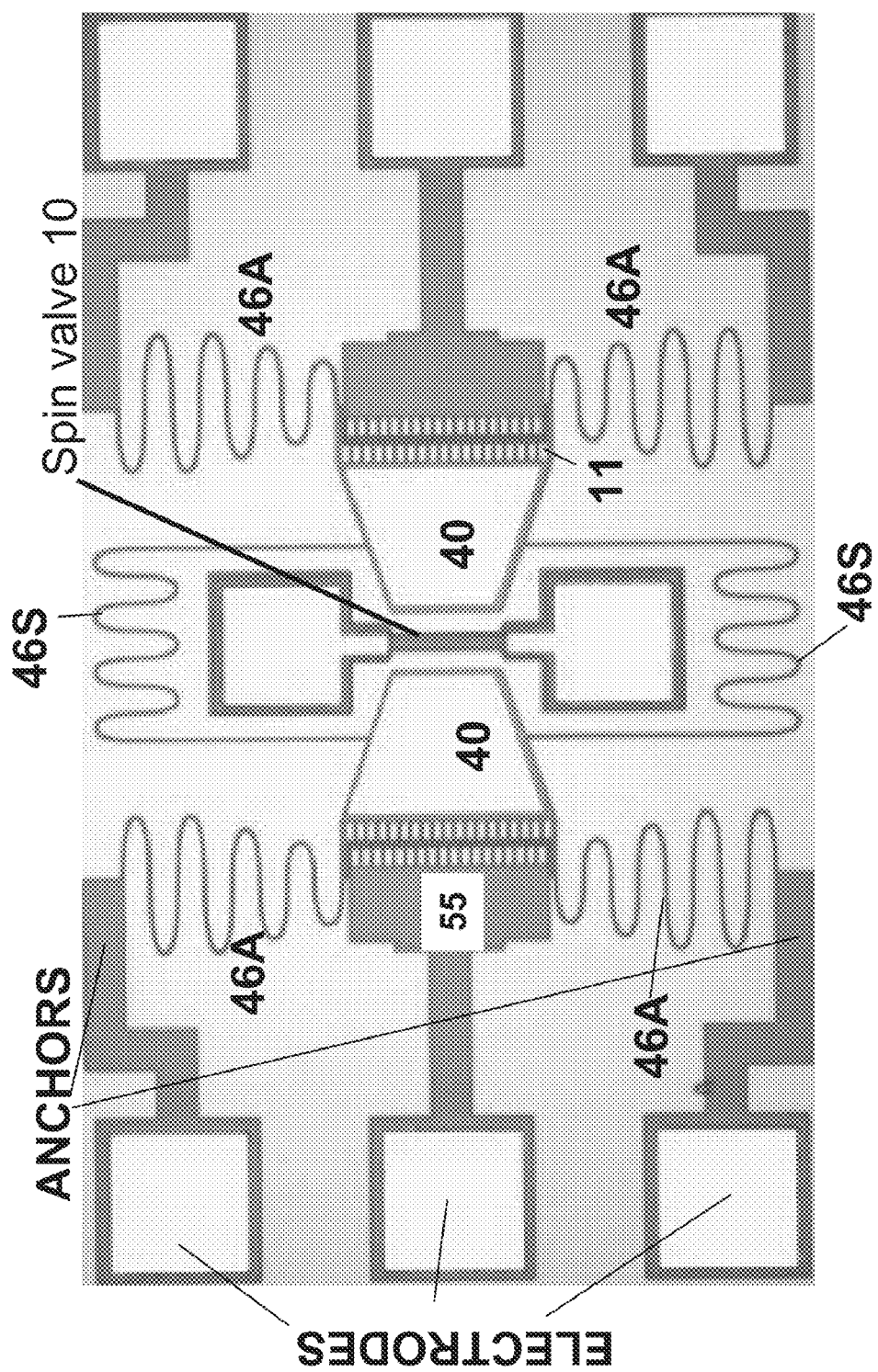
FIG. 23 illustrates the design of the MEMS devices with a alternate spring configuration 46S, 46A with a different resonant frequency.

The flux concentrators 40B, 40C, coupled with the elements of the present invention, may potentially enhance the magnetic field at the position of the magnetic sensor 10 by a factor ranging from 1.5 to as much as a 100. Preferably, the flux concentrators 40B, 40C are comprised of soft magnetic materials such as permalloy. According to the embodiments of the invention, the flux concentrators 40B are deposited on MEMS structures 51, as shown in FIGS. 6 and 7. The substrate may be a silicon on insulator (SOI) wafer, but other substrates may be used as is well known to those of ordinary skill in the art. Preferably, the SOI wafer is used in lieu of a plain silicon wafer because fewer processing steps are required. The SOI wafer may comprise a thin upper device layer of silicon separated from a thick layer (also referred to as the handle layer) of silicon by an approximately 1 to 5 micron silicon dioxide ($SiO_2$) layer. There are anchors of $SiO_2$ (as shown in FIG. 23) that connect one end of the springs 46A of the MEMS structure 51 to the handle wafer (as shown in FIG. 23). From a different perspective, the support 55 in FIG. 23 is connected to the handle wafer beneath through the silicon dioxide layer.

Figure 15:
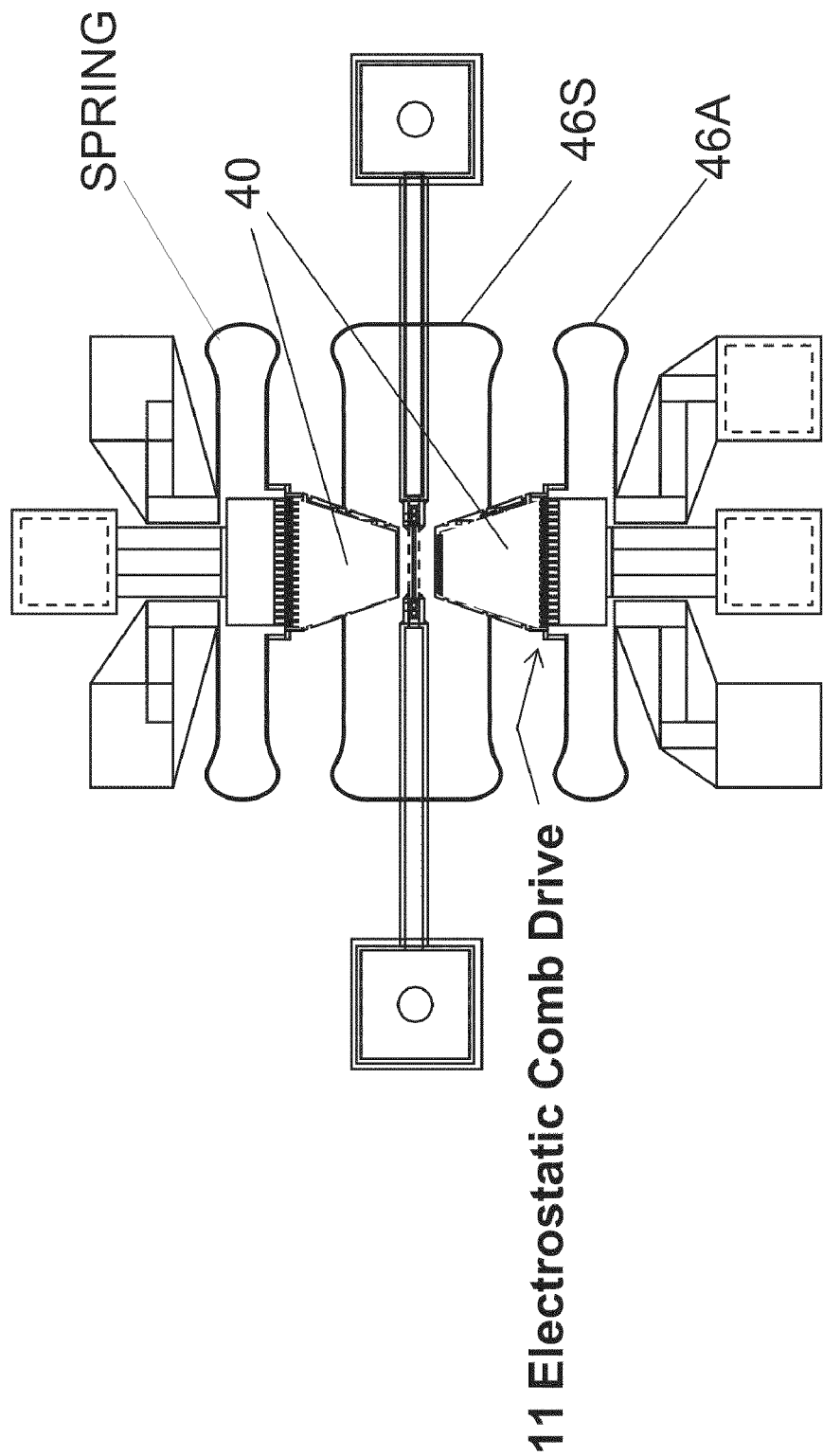
FIG. 15 is an illustration of a portion of a preferred embodiment showing the flux concentrators 40, springs 46S, 46A, and the location of the sensor 10.

The MEMS structures 51 and flux concentrators 40B are driven to oscillate at frequencies on the order of 10 to 30 kHz by electrostatic comb drives 11. The electrostatic comb drives 11 (as shown in FIGS. 15 and 16) have the advantage that they provide sufficient force to drive the flux concentrators 40B and springs 46S (and/or 46A, FIG. 15) and that, unless the amplitude of the motion is too large, the force is independent of displacement.

Figure 17C:
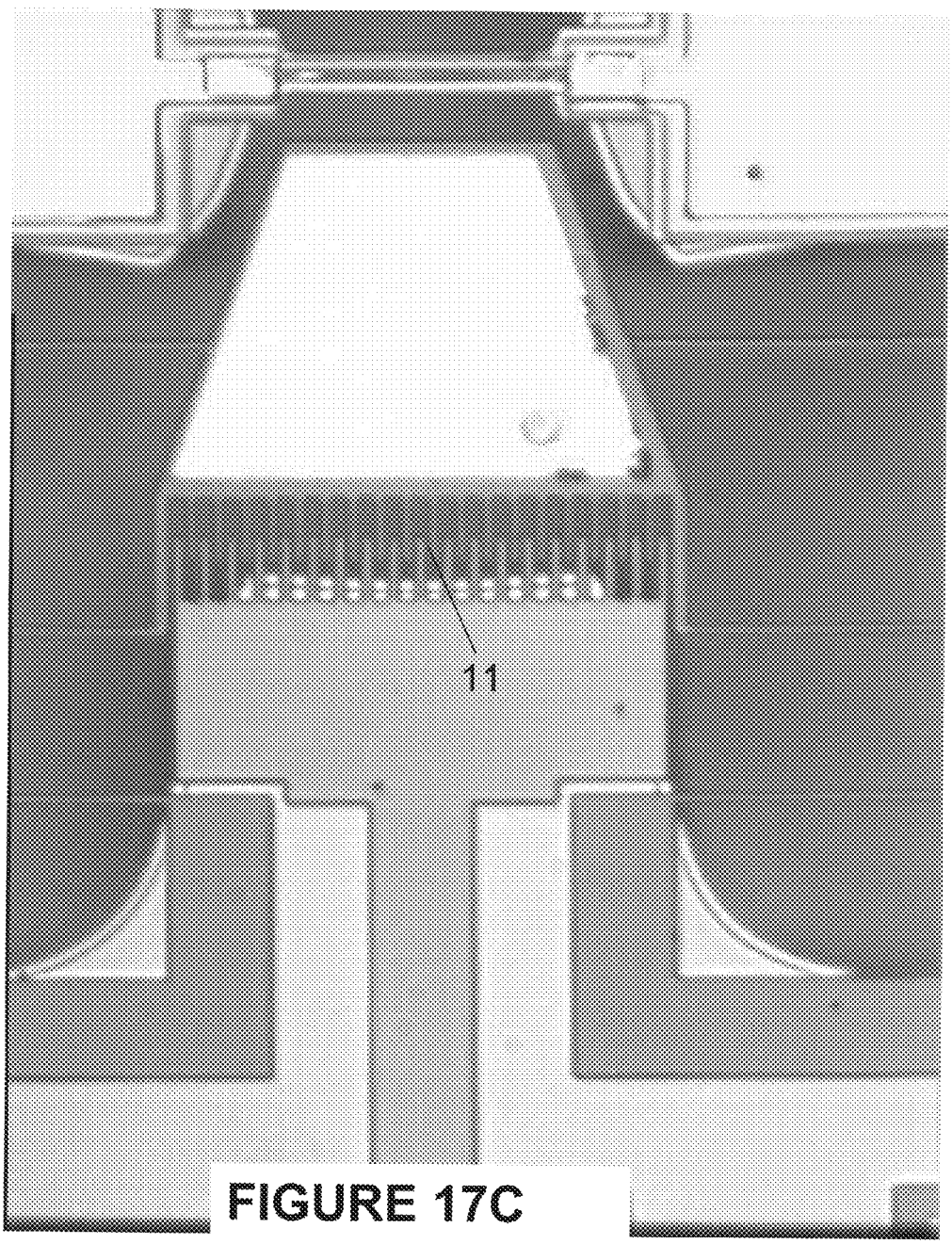
FIG. 17C is an illustration of the electrical comb 11 showing the overlap of the teeth used to transfer the ac driving current.
Figure 18:
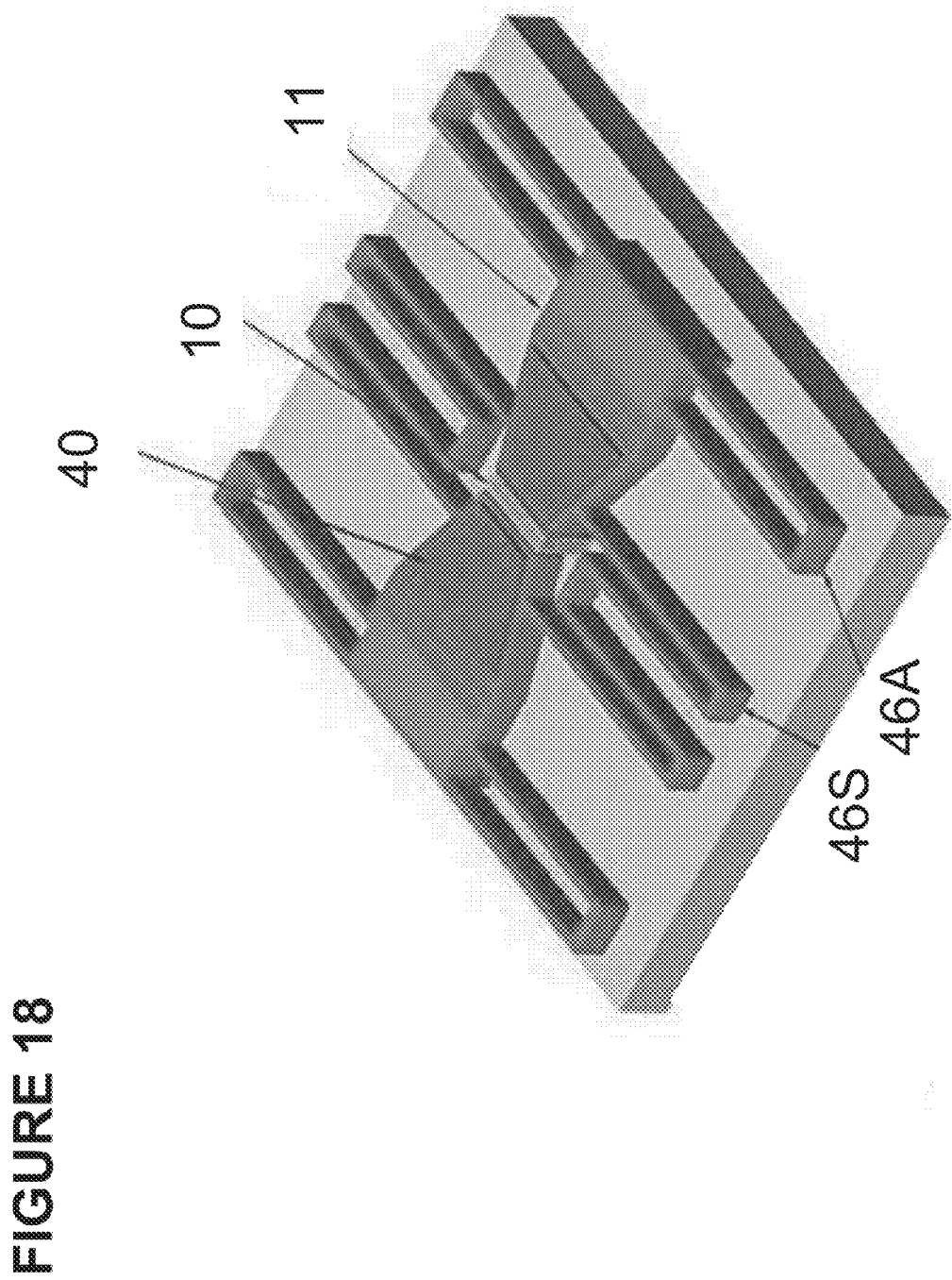
FIG. 18 illustrates a perspective view of the flux concentrators.

The flux concentrators 40B on the MEMS structure may be connected by the springs 46 or the flux concentrators may be rigidly connected to one another so that the flux concentrators 40B have a common normal mode frequencies. This is a feature of one mode of the embodiments of the invention because if the motion of the two flux concentrators 40B is not coupled, the relative phase between the motion of the flux concentrators 40B would tend to drift. When the flux concentrators 40B oscillate, they modulate the field at the position of the magnetic sensor 10. This shifts the operating frequency of the MEMS device from the high 1/f noise region at low frequencies to higher frequencies where the sensor noise is orders of magnitude lower. Moreover, the thickness of the springs 46S (and/or 46A) and separation of the teeth in each of the comb drives 11 (as shown in FIG. 17C) is approximately 2 to 4 μm.

In the preferred embodiment shown in FIGS. 5 and 6, there is a flux concentrator 40B on the MEMS structure 51 and a flux concentrator collector 40C on each side of the magnetic sensor 10. As described above, the flux concentrators 40B are driven to move by an ac power source at a frequency f and oscillate in the directions of the arrows shown in FIG. 5. The flux concentrator collectors 40C need not move with the ac power source and overlap the flux concentrators 40B by a distance X, as shown in FIG. 6, which varies according to the movement of flux concentrators 40B. The flux concentrators 40B may be each mounted on separate MEMS structures 51 as shown in FIG. 5 or, in the alternative, may be mounted together on a MEMS structure separated by an area without permalloy. The flux collector/concentrators 40C, which may be larger, are mounted in association with the upper or sensor chip 52, which also may support sensor 10, for fabrication purposes. Because the flux concentrator/collectors 40C are not attached to the movable flux concentrators 40B, the additional mass contained in the flux collectors/concentrators 40C, does not result in the change to the resonant frequency of the movable flux concentrators 40B that occurs when the mass is increased in the movable flux concentrators 40B.

The overall objective is to maximize the collection of the flux to be measured. There are several geometries that can be used for the flux collector/concentrators 40C. One improvement realized by the present invention is the increase in lateral size of the flux collector/concentrator 40C without increasing the mass of the flux concentrator 40. Flux collector/concentrators 40C are preferably made of permalloy (80% nickel and 20% iron) or some other material with a high magnetic permability and can be mounted on a sensor chip 52, as shown in FIG. 7, which may be a silicon compound or the like. One of ordinary skill in the art would readily appreciate that several other alloys or compounds could be used in place of permalloy that have magnetism retention characteristics similar to permalloy. The flux collector/concentrator 40C in FIG. 5 is shown as having a trapezoidal configuration. However, any configuration that would increase the collection of flux for passage onto the flux concentrator 40B could be used, including flux/collector concentrators which are trapezoidal in a direction perpendicular to longitudinal axis of the device shown in FIG. 5, and extending vertically from the illustration of flux collector/concentrators 40C (which may be fixed) shown in FIG. 6. The flux collector/concentrators 40C may be mounted on a sensor chip 52 as shown in FIGS. 6, 7. Since the flux collector/concentrators 40C are preferably independent from the flux concentrators 40B, and consequently, do not contribute to the weight of the flux concentrators 40B, resulting in more flux flowing to the flux concentrators 40B without the drawback of additional weight considerations that would effect the movement or oscillation of the flux concentrators 40B. Flux concentrators 40B may be mounted on portions of MEMS structure 51 as shown in FIG. 7.

In the simplest form of flux concentrators 40B, 40C the permalloy portion consists of a single layer of a soft ferromagnetic material. Alternatively, the flux concentrators 40B, 40C can be constructed in multiple layers in which different layers of soft ferromagnetic material or magnetic alloys are separated by non-ferromagnetic layers.

The MEMS structure 51 and sensor chip 52 may be silicon or the like. The separation between the two chip layers is 2-8 microns. As the MEMS structures oscillate, the overlap of the flux concentrators shown in FIG. 5 is always large compared with the separation between the chips. In this case, most of the flux lines will be transferred from the large flux collector/concentrator 40C to the small flux concentrator 40B. In a second mode, the motion of the flux concentrators 40 move in phase as shown in FIG. 7. In the motion of the in-phase mode, the separation between the flux concentrators stays constant. The motion of the MEMS structure may be either in the in-phase or out-of-phase mode. FIG. 1 illustrates the time where the gap is centered at the sensor. At this time, the field is maximum. The field is minimum when the flux concentrators have the position shown in FIG. 6. In an alternate embodiment of the present invention, both portions of the flux concentrators 40B are mounted on a single substrate portion which has no permalloy in between the flux concentrators 40B.

As discussed in the foregoing, it is somewhat difficult with large flux concentrators 40B to get a large, high frequency, modulating magnetic field. The supplemental flux collector/concentrators 40C achieves more desirable results. The small flux concentrator 40B can be energized to move at frequencies up to 30 kHz with an amplitude of modulation of a factor of about 5 modulation, with an amplification of the magnetic field by a factor of 2. The large flux collector/concentrator 40C can have dimensions of 1 mm or more and potentially may concentrate the magnetic field by a factor of about hundred, because of the improve demagnetization factor. Thus, the field at the position of the sensor potentially may be amplified by a factor of about 10 or more instead of a factor of two and it can still be modulated at a high frequency.

The flux concentrators 40B on the MEMS structures 51 may be connected by a spring type supports 46S, 46A as shown schematically in FIG. 16, which permits movement along the longitudinal axis of the device. The spring type support 46S is fabricated to support the flux concentrators 40B and permit the in-plane motion of the MEMS structure in a direction along a line B-B shown in FIG. 16 when they are driven by the ac power source at frequency f. The ac drive is inputted in the manner shown in FIG. 1(A) of U.S. Pat. No. 7,195,945, hereby incorporated by reference. As in the '945 patent, comb drives supply a voltage at a frequency f to drive the flux concentrators 40. This voltage, independent of its sign, creates a force that tends to increase the overlap of the teeth 11 of the comb drives. Because the force is independent of the sign of the applied voltage, the MEMS motion occurs at a frequency 2f. Thus, the signal is insensitive to pickup at the drive frequency f Alternatively, the motion of the MEMS structure may be driven by applying both an AC and a DC voltage. The voltage across the sensor 10 is amplified by a broadband amplifier (not shown) and demodulated. FIG. 115 shows the electrostatic comb drives 11 of an embodiment of the present invention.

The flux concentrators 40B can be operated in two modes. In mode 1, the motion of the flux concentrators 40B is out of phase in the sense that the separation between the MEMS structures oscillates in time. The magnetic field at the position of the sensor increases and decreases depending upon the separation and location, as is well know to those of ordinary skill in the art.

One method of making an embodiment of the invention comprises a method of fabricating a MEMS device, wherein one embodiment comprises forming a magnetic sensor over a silicon base, such as a silicon on insulator (SOI) wafer; forming a pair of MEMS flux concentrators sandwiching the magnetic sensor; connecting an electrostatic comb drive to each of the MEMS flux concentrators; and optionally connecting at least one spring to the pair of MEMS flux concentrators and the electrostatic comb drive. The methodology may also comprise performing a plurality of deep reactive ion etching (DRIE) processes on an SOI wafer; and releasing the MEMS flux concentrators, the electrostatic comb drive, and (optionally) at least one spring formed from the device layer of the SOI wafer. (The magnetic sensor may be formed by providing an antiferromagnetic layer; positioning a first ferromagnetic layer over the antiferromagnetic layer; positioning a conducting layer over the first ferromagnetic layer; and positioning a second ferromagnetic layer over the conducting layer.)

The plurality of DRIE processes may comprise performing a DRIE process on the device layer of the SOI wafer to define the flux concentrators on the MEMS structures, the electrostatic comb drives, and optionally one or more springs. Moreover, the flux concentrators may comprise a layer of soft ferromagnetic material on a portion of the device layer of the SOI wafer. An HF process may be used to remove the silicon dioxide from beneath the MEMS flux concentrator and thereby release the MEMS structure 51 and electrostatic comb drive 11. Furthermore, the MEMS flux concentrators preferably comprise a double layer of Cr and permalloy.

Moreover, the plurality of processes may comprise performing a process on the device layer of the SOI wafer to define the MEMS flux concentrators 40, 40B, the electrostatic comb drives 11, and the at least one spring 46, 46S, and/or 46A. Furthermore, the MEMS flux concentrator preferably comprises a layer of silicon dioxide thereunder, wherein the plurality of release processes may comprise methodology for removing the layer of silicon dioxide from beneath the MEMS flux concentrator and MEMS structure. Additionally, if the insulator is something other than silicon dioxide, such as an epoxy, the releasing of the MEMS flux concentrators and MEMS structure, the electrostatic comb drive, and the at least one spring from the SOI wafer may be performed using oxygen plasma. The intermediate layer may comprise an epoxy layer. Also, the MEMS flux concentrators may comprise a double layer of Cr and permalloy.

Another preferred embodiment of the invention provides a method of fabricating a MEMS device, wherein the method comprises forming a first wafer; forming adhesive bumps on the first wafer; forming a magnetic sensor on the first wafer; forming a second wafer; forming a pair of MEMS flux concentrators, a pair of electrostatic comb drives, and at least one spring on the second wafer, wherein the pair of MEMS flux concentrators, the pair of electrostatic comb drives, and the at least one spring are connected to one another, and wherein the pair of MEMS flux concentrators sandwich the magnetic sensor. The method further includes bonding the second wafer to the adhesive bumps; and compressing the adhesive bumps using non-thermal means.

Preferably, the adhesive bumps comprise indium. Additionally, the nonthermal means preferably comprises pressure. Preferably, the magnetic sensor is formed by providing an antiferromagnetic layer; positioning a first ferromagnetic layer over the antiferromagnetic layer; positioning a conducting layer or the insulating layer over the first ferromagnetic layer, and positioning a second ferromagnetic layer over the conducting layer or insulating layer. Furthermore, the first wafer preferably comprises a SOI wafer and the second wafer preferably comprises silicon or silicon nitride. Also, the MEMS flux concentrators may comprise a double layer of Cr and permalloy.

The task of fabricating the device is provided according to the embodiments of the invention by combining two very different technologies, MEMS fabrication technology and magnetic sensor technology. The resulting device may increase the sensitivity of small, low cost, magnetic sensors by one to three orders of magnitude. The device can be fabricated on wafers by low cost, mass production techniques. Moreover, powering the motion of the MEMS structures only requires microwatts of energy.

Figure 21:
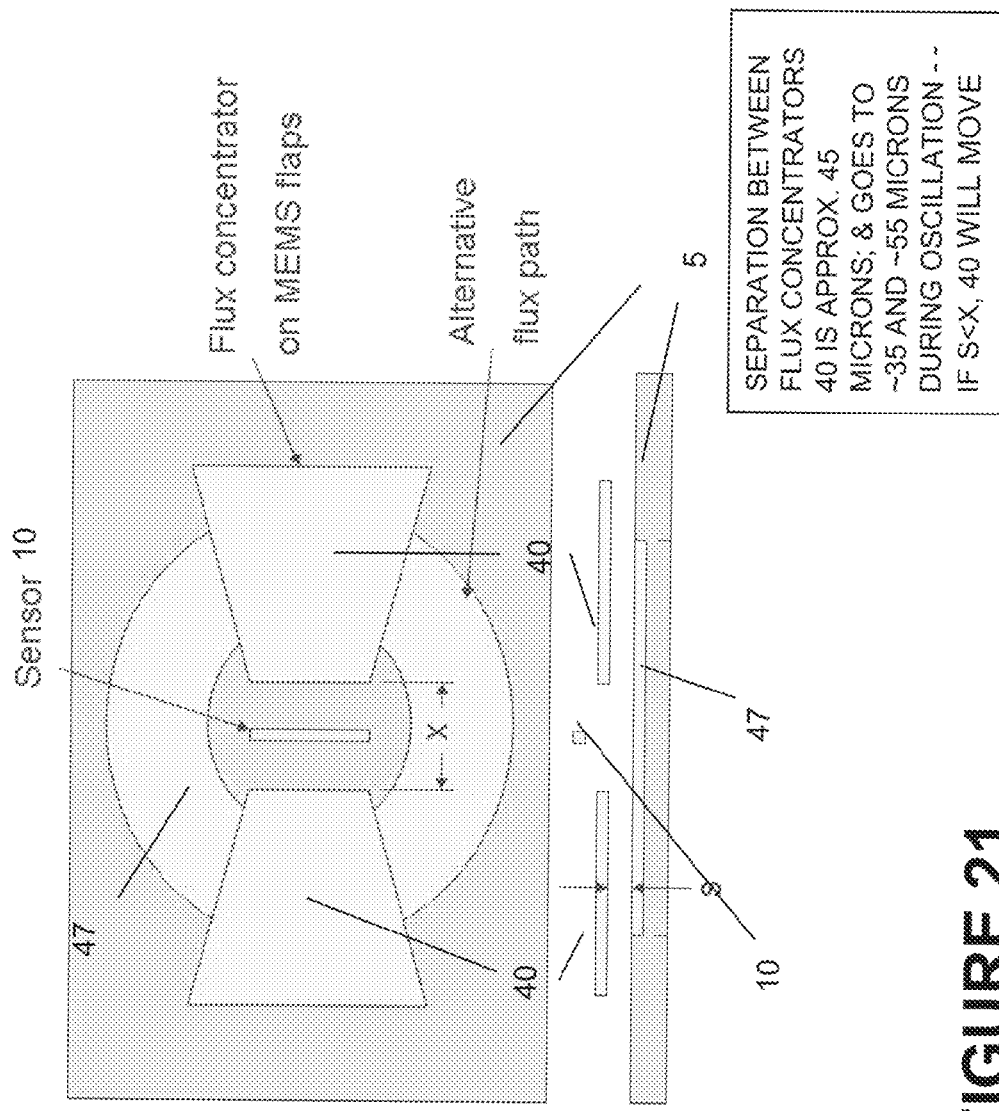
FIG. 21 illustrates an alternative embodiment of the present invention having a stationary alternate flux path 47.

ALTERNATE FLUX PATHS—In the alternate embodiments shown in FIGS. 19-21, methods are described for producing alternative magnetic flux paths.

For the embodiment illustrated in FIG. 19, as the separation between the flux concentrators 40 increases, the separation between the soft magnetic material 48 decreases. This motion will draw flux lines away from the sensor. This will increase the amplitude of the field modulation. Although springs 50S are used in conjunction with the embodiment illustrated in FIG. 19, alternate mechanical/electrical subsystems which move the soft magnets 48 in and out (as illustrated in FIG. 20) as the flux concentrators oscillate, may be used without departing from the scope of the invention.

FIG. 20 shows an alternative method of modulating the field at the position of the sensor 10 as the flux concentrators 40 oscillate. FIG. 20 illustrates using a pivot 53 and lever subsystem 54 to get mechanical gain of the motion of the soft magnetic material 48 that moves as the flux concentrators 40 oscillate. This method has the advantage that there is mechanical gain, i.e., a small amount of motion of the flux concentrators 40 will lead to a large motion of the soft magnetic material. The disadvantage is that is will require more force to produce the oscillation of flux concentrators 40. Although a lever subassembly is used in conjunction with the embodiment illustrated in FIG. 20, alternate mechanical/electrical subsystems which move the soft magnets 48 in and out (as shown by the arrows in FIG. 20) in synchronism with the movement of flux concentrators 40 may be used without departing from the scope of the invention.

The embodiment of FIG. 21 uses an alternative flux path that is stationary. The upper portion of FIG. 21 shows a schematic picture that includes the alternative path. The alternative flux path may be a layer of a soft magnetic material, such as permalloy, deposited inside a depression made in the bottom of the chip containing the MEMS structure. The depression in the bottom of the chip containing the MEMS structure may be made by deep reactive ion etching (DRIE). If $s \ll x$, most of the flux travels between the MEMS structures. In this case, the sensor "sees" the maximum field. If $s \gg x$, then most of the flux goes around the alternative flux path and the sensor "sees" a smaller field. Thus, the oscillation of the MEMS structures causes an increased modulation of the field at the position of the sensor. In the first method, the alternative flux path changes as the MEMS structures oscillate.

The methods in FIGS. 19, 20 and 21 provide a larger field modulation for the same amount of motion of the MEMS structures. It is further noted that the secondary flux concentrators 40C, which may be mounted on a sensor chip 52, shown in FIGS. 6 and 7 can be used in conjunction with the embodiments shown in FIGS. 19, 20, and 21. Likewise, the springs 50S may be used to support the flux concentrators 40 and comb drives 11 (such as that shown in FIG. 17A) may be used to power the flux concentrators 40 in FIGS. 19-21. Although only the springs of the MEMS structure is illustrated in the embodiments of FIGS. 19 and 20, one of ordinary skill in the art would appreciate that the flux concentrators 40 of FIGS. 19 and 20 could be mounted in conjunction with the MEMS structure 51 as shown in FIGS. 5 and 6. Likewise the sensor 10 may be mounted on a sensor chip 52 as shown in FIG. 7.

During one method of fabrication of the embodiment shown in FIGS. 5 and 6, the flux concentrators 40, comb drives 11, and springs 46 may be released from the SOL wafer 5 by dipping the MEMS device into hydrofluoric (HF) acid. Substantially the same methods can be utilized for the alternate embodiments shown in FIGS. 19-21 for like components, but details are omitted for the sake of brevity. Alternatively, one can use HF vapor instead of HF liquid. The HF acid removes portions of the insulating $SiO_2$ layer. Alternatively, one could use an alternate wafer in which the $SiO_2$ layer of the SOI wafer (of FIG. 10C) is replaced by an approximate 20 m thick epoxy layer as shown in U.S. Pat. No. 7,195,945, incorporated by reference. For example, the type of epoxy material that may be used is described in U.S. Pat. No. 6,617,657, the complete disclosure of which, in its entirety, is herein incorporated by reference. Except for the fact that the SiO2 layer is replaced by the epoxy layer, the properties of this alternate wafer are very similar to the wafer shown in, inter alia, FIG. 7. This alternative approach has the advantage that the epoxy layer 19 can be removed during the release step by exposing the MEMS device to an oxygen plasma environment. This eliminates the problem of possible damage to the magnetic sensor 10 caused by the HF during the release step.

Figure 14:
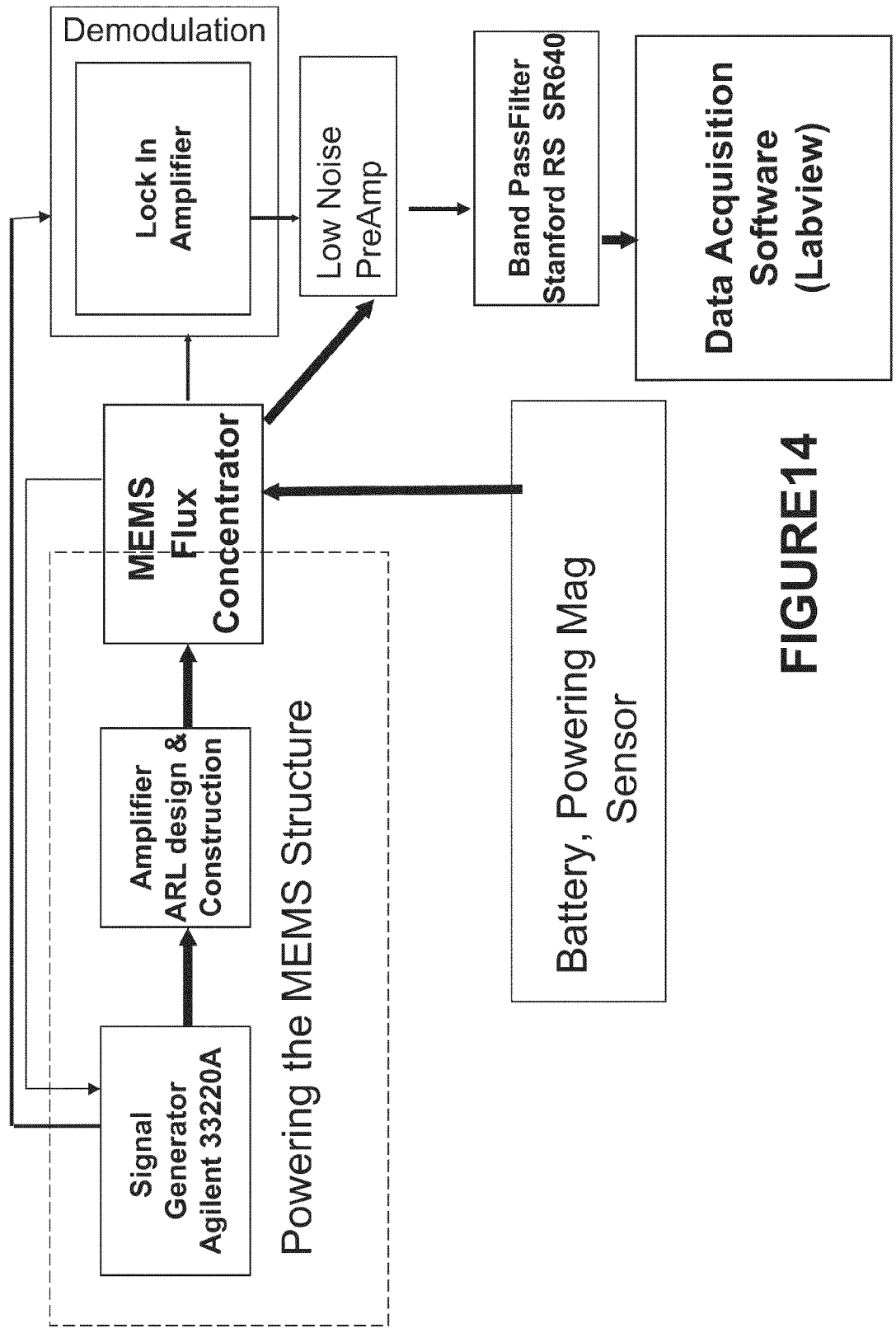
FIG. 14 is a block diagram of the components of a magnetic sensor assembly.

FIG. 14 is an overall block diagram of a sensor system of a preferred embodiment of the present invention. The system may utilize off-the-shelf items such as a Tektronix™ TDS 3014 scope, Mag Agilent 33220A signal generator, National Inst. BNC-2090, and Agilent 34401A multimeter.

Optimal Magnetic modeling was done using the finite element code Maxwell from Ansoft. This modeling was used to choose the separation between the flux concentrators, the thickness of the ferromagnetic films, and how much motion was required to obtain an adequate modulation. Based on the modeling, it was estimated that ¼ micron thick permalloy flux concentrators separated 45 microns oscillating with a 12 micron amplitude would provide an enhancement of the magnetic field that varies between 6 at the smallest separation and 2 at the largest separation.

In the preferred embodiments, the flux concentrators may be driven by electrostatic comb drives. This design provides large displacements and has the further advantage that the force is independent of the displacement. The finite element program ANSYS was used to do the mechanical modeling. In each design, the MEMS structures on each side of the sensor are connected by a MEMS spring so that their motions are correlated. If this spring were omitted, it would by very difficult to maintain the correct phase relationship between the motions of the two MEMS structures. Because of the spring, there are two basic in-plane normal modes. One in which their motion is in phase and the other in which they are 180 degrees out of phase. The latter occurs at a higher frequency because, for this mode, the connecting spring must be compressed. Thus, the higher of the two frequencies for each design is for the 180 degree phase difference normal mode used to modulate the magnetic field.

It is preferable that the magnetic sensor 10 is responsible for most of the 1/f noise and not some other part of the sensor system. This feature of the embodiments of the invention greatly reduces the 1/f noise of the magnetic sensor 10. However, it does not contribute to the reduction of the 1/f noise of the flux concentrators 40. Thus, it is preferable that the 1/f noise of the flux concentrators 40 be much less than the 1/f noise of the magnetic sensor 10. This constraint was experimentally verified. Experimentally, the noise power spectrum was measured on spin valves, which is a type of GMR sensor, both with and without flux concentrators 40. The measurements were repeated with different currents passing through the spin valves. The results of these measurements are shown in FIG. 2 of U.S. Pat. No. 7,195,945. hereby incorporated by reference. The curves are labeled by the value of the resistor in series with the spin valve 2 that limited the current, 1, through the spin valve 2. The resistance of the spin valve 2 is approximately 400 ohms. The noise is much higher for lower values of series resistance because the 1/f noise is expected to increase as $I^2$. Of more significance, the noise power spectra are substantially similar for different currents passing through the spin valves 10 with and without the flux concentrators 40. This result implies that 1/f noise of the flux concentrator 3 is much less than the 1/f noise of the spin valve 10. The likely explanation for the result that 1/f noise of the flux concentrator 40 is much less than the 1/f noise of the spin valve 10 is that the flux concentrator 40 is structurally much larger than the spin valve 10. Optionally, the flux concentrator 40 may be on the order of approximately 1,500 times larger than the spin valve 10.

During operation, a constant current is sent through the spin valve magnetic sensor 10 and the resulting voltage is sent to the signal processing electronics (not shown). This signal is modulated by the motion of the flux concentrators 40, comb drives 11, and springs 46. A voltage at a predetermined drive frequency is applied to drive the motion of the flux concentrators 40, comb drives 11, and springs 46 (or in embodiment of FIG. 15, 46S, 46A). This voltage, independent of its sign, creates a force that tends to increase the overlap of the teeth of the comb drives 11. Because the force is independent of the sign of the applied voltage, the MEMS motion occurs at a frequency double the original predetermined drive frequency. Thus, the signal is insensitive to pickup at the predetermined drive frequency. Alternatively, the drive voltage may be a combination of a DC and an AC voltage. The voltage across the spin valve 2 is amplified by a broadband amplifier (not shown) and demodulated.

When the magnetic sensor 10 selected is a magnetoresistive element, a Wheatstone electrical bridge configuration may be used to interface with the magnetic sensor. Accordingly, the resistance of the magnetoresistive element changes because of a magnetic field, the bridge output voltage is modulated at a frequency of $f_m$ typically the resonant frequency of the suspended silicon MEMS structures, by the motion of the MEMS flux concentrators 40. The signal can then be amplified by a narrow band amplifier and then demodulated. The bandwidth of the amplifier only has to be broad enough to include the low frequencies in the original signal coming into the MEMS flux concentrator.

Regarding fabrication processes, one methodology is described in U.S. Pat. No. 7,195,945. As described therein, the first step in the fabrication process of the MEMS device 1 is the deposition of the spin valves on the SOI wafer. For example, spin valves, such as those available from NVE Corporation, Minnesota, USA and having a magnetoresistance of approximately 5%, may be used. Spin valves were chosen as the magnetic sensor 10 in an embodiment of the invention disclosed in the '945 patent because they then represented a mature technology with a significant amount of 1/f noise. As shown in FIG. 3 of the '945 patent, the spin valve 2 is generally configured as a multi-layered structure comprising a plurality of magnetic films 14. The magnetic films 14 are preferably deposited on a silicon nitride-covered wafer 13 by radio frequency (RF) diode sputtering. A magnetic field of approximately 20 Oe is applied during the deposition to induce the magnetic easy axes and pinning direction. The magnetic films 14 comprise an antiferromagnetic layer (preferably comprising CrPtMn) 15 and two thin ferromagnetic layers 16, 18 separated by a thin conducting layer (preferably comprising Cu) 17. The rotation of the magnetization of one of the ferromagnetic layers (preferably comprising CoFe) 18, the pinned layer, is hindered by exchange interactions at the interface with the antiferromagnetic layer 15. The magnetization of the other ferromagnetic layer; i.e., free layer 16 rotates in response to an applied field. The resistance of the magnetic films 14 has its minimum value when the magnetizations of the two ferromagnetic layers 16, 18 are parallel. Following the deposition of magnetic films 14, the unpatterned sensor wafer 13 is annealed in forming gas at approximately 200° C. for approximately 2 hours. Following the patterning of the device stripes, the sensor wafer 13 undergoes a sequence of annealing steps (temperature up to approximately 265° C.) to establish the magnetization of the pinned layer 18 across the stripe, and the magnetization of the free layer 16 down the stripe. The magnetic sensors are patterned approximately 3 μm wide and approximately 88 μm long.

The flux concentrators 40B, 40C may, for example, be trapezoidal in shape and may be made by 20 DC magnetron sputtering of two repeats (i.e., double layer) of approximately 40 Å Cr/1,500 Å permalloy films (Cr films and permalloy films) deposited on photoresist covered SOI wafers 6 as shown in FIG. 4 of the '945 patent. The base pressure is approximately 2×10-7 Torr. No bias voltage or substrate heating is applied during the deposition. In one method, the Cr is deposited at approximately 1.5 mTorr with approximately 60 W of DC power. The permalloy is deposited at approximately 1.25 mTorr at approximately 300 W of DC power. The deposition conditions are chosen to maximize domain size and to minimize film stress. The intervening Cr films serves to break up the magnetic and structural continuity of the permalloy films and thus suppress the formation of a stripe-like magnetic domain configuration and to achieve high magnetic permeability. The height of the flux concentrator 40B may be approximately 104 μm. The short side of the trapezoid configuration of the flux concentrator may be approximately 83 μm long and the longer, back side of the trapezoid configuration of the flux concentrator may be approximately 150 μm long.

The size of the flux concentrators 40B may be limited by the need to keep the resonant frequency of the flux concentrators 40B, comb drives 11, and springs 46 in the range of several kHz or higher. The values for the enhancement provided by the flux concentrators 40B are calculated when the separation between the MEMS flux concentrators 40B is at their planned maximum and minimum displacements. These values may be approximately 1.5 and 3.5, respectively.

The mechanical resonant frequencies of seven different MEMS devices 1 are calculated for using mechanical finite element calculations. Table 1 in the '945 patent (hereby incorporated by reference) shows the results of these calculations. The two low frequency normal modes for in plane motion are for the two concentrators to move in phase with one another or 180 degrees out of phase. Although in the embodiment shown in the '945 the desired mode was when the two MEMS structures 7 were 180 degrees out of phase, a desired mode in the embodiment pictured in FIG. 1 is for the two concentrators 40 to be in phase.

In the '945 patent, the out-of-phase mode was the desired mode because at higher frequencies because the spring 5 connecting the two MEMS structures 7 was compressed. In a preferred embodiment of the present invention described herein, both flux concentrators 40 are mounted on a single substrate portion and separated by the lack of permalloy. Accordingly, when in the in-phase mode, the flow of flux into the sensor 10 is maximized when the concentrators 40 are in the position shown in FIG. 5 and minimized when in the position shown in FIG. 7.

Magnetoresistance based magnetometers constructed in accordance with the principles of the present invention have the potential to have a detectivity of 2 pT (pico tesla) per square root Hz at 1 Hz producible at relatively low cost (<$100), consume small amount of energy (<1 mW), large bandwidth, (0.001 Hz≦f≦10 Meg Hz).

Larger modulation of the magnetic field by amplitude modulation may be limited by the amplitude of the MEMS motion and the magnetic field profile. One may increase the detectivity to approximately 2 picoTesla and amplitude of the motion of the MEMS structure from 5μ to 15μ by vacuum packaging, which will increase the Q from 30 to 300 and lengthening and increasing the number of teeth in comb drive. The magnetic field profile may be changed to increase the field change per micron of displacement. The combined effect of increasing the modulation amplitude and field profile may theoretically result in a detectivity of 2 pT.

The following tables include theoretical "Best Compromise" Parameters" for 1 picoTesla/rt(Hz) @ 1 Hz.

| Design Parameters | |
|---|---|
| Junction Voltage | 0.1 V |
| MTJ's per leg | 20 |
| Junction Area | 30000 um$^2$ |
| Tweakable Parameters | |
| Anisotropy Field Bsat | 1.00E−003 T |
| Delta · R/R · low, <NOTE | 100% |
| Flux concentrator gain | 5 |
| Amplifier Noise | 5 nV/Hz$^{0.5}$ |
| Temperature | 300K |
| Junction Resistance Area | 1 MOhm um$^2$ |
| Ms | 8.00E+005 A/m |
| Damping alpha | 0.01 |
| Electronic 1/f noise alpha | 1.00E−009 um$^2$ |
| Operating frequency | 10000 Hz |
| Free layer Thickness | 1 um |
| Magnetic 1/f noise alpha | 1.84E−15 um3 |
| Constants | |
| e | 1.60E−019 A · s |
| kB | 1.38E−023 J/K |
| Gamma | 2.21E+005 mA$^{-1}$s$^{-1}$ |
| mu zero | 1.26E−006 TmA$^{-1}$ |

TABLE

Circuit Parameters and Noise Analysis

| Circuit Parameters | | |
|---|---|---|
| Supply Voltage | 4 | |
| Junction Resistance | 33.33 Ohms | kT 4.14E−021 J |
| Current | 3.00E−003 A | gammaMs 1.77E+011 s$^{-1}$ |
| Power | 0.024 W | |
| Sensitivity | 6666.67 V/T | |
| free layer volume | 3.00E−014 m$^3$ | |
| Noise Analysis | | |
| Voltage noise power Amplifier Noise | voltage noise | field noise |
| 2.50E−017 V$^2$/Hz Johnson/Shot coth arg 1.93E + 000 Shot Dominated | 5.00E−009 V/Hz$^{0.5}$ | 7.50E−013 T/Hz$^{0.5}$ |
| 2.23E−017 V$^2$/Hz Electronic 1/f noise | 4.72E−009 V/Hz$^{0.5}$ | 7.08E−013 T/Hz$^{0.5}$ |
| 6.67E−019 V$^2$/Hz Thermal Mag noise | 8.16E−010 V/Hz$^{0.5}$ | 1.22E−013 T/Hz$^{0.5}$ |
| 8.72E−024 V$^2$/Hz Magnetic 1/f noise | 2.95E−012 V/Hz$^{0.5}$ | 8.86E−015 T/Hz$^{0.5}$ |
| 3.41E−020 V2/Hz | 1.85E−010 V/Hz0.5 | 5.54E−013 T/Hz0.5 |
| Noise Total | | 1.18E−012 T/Hz$^{0.5}$ |

As used herein the terminology "flux concentrator" or "flux collector" means an element which can absorb magnetic flux in a manner so either (a) the amount of flux per unit area or density is increased as the magnetic flux traverses the element or (b) the magnetic flux is gathered and inputted through a relatively large cross sectional area and outputted through a cross sectional area that is narrower than the input.

As used herein the terminology 1/f-type noise refers to any noise with a power spectral density of the form $$S(f) \propto 1/f^\alpha$$

where f is frequency and 0<a<2, with a usually close to 1. Such "1/f-type" noises occur widely in nature and are a source of considerable interest in many fields.

As used herein the terminology "spring mass combination" refers to the interaction between the spring (or spring constant) and mass by which a natural resonant frequency is achieved. Similar to a harmonic oscillator system, when the movable flux concentrator is displaced from its equilibrium position, experiences a restoring force, F, proportional to the displacement, x according to Hooke's law: F=−kx, where k is a spring constant. If F is the only force acting on the system, the simple harmonic oscillator will undergo simple harmonic motion: sinusoidal oscillations about the equilibrium point, with a substantially constant amplitude and a substantially constant frequency (which does not depend on the amplitude).

Obviously, many modifications and variations of the present invention are possible in light of the above teachings. It is therefore to be understood that, within the scope of the appended claims, the invention many be practiced otherwise than as specifically described.

What is claimed is:

1. A microelectromechanical modulating magnetic sensor comprising:
    a base;
    a magnetic transducer associated with the base that provides an output in response to a magnetic field; at least part of the magnetic transducer being positioned in a first plane;
    a plurality of movable flux concentrators positioned to move relative to the magnetic transducer; the plurality of movable flux concentrators having a region of maximum concentration of flux at a predetermined region associated with the positions of the plurality of movable flux concentrators; the plurality of movable flux concentrators being substantially located in a second plane and oscillating substantially within the second plane; the second plane being substantially parallel to the first plane;
    at least one flux collector positioned to collect flux for transfer onto at least one movable flux concentrator; at least part of the at least one flux collector being located substantially in the first plane such that the at least one flux concentrator overlaps at least one of the plurality of movable flux concentrators to enable continuous flux transfer during the movement of the plurality of movable flux concentrators from the at least one flux collector onto a first of the plurality of moveable flux concentrators; and, during movement of the movable flux concentrators, flux is transferred from the first of the plurality of movable flux concentrators to a second of the plurality of movable flux concentrators; the first and second movable flux concentrators being positioned a fixed distance apart such that a region of maximum concentration of flux forms therebetween; the first and second movable flux concentrators moving in tandem from a first position in which one of the first and second movable flux concentrators shields the magnetic transducer from the flux which flows between the first and second movable flux concentrators to a second position in which the magnetic transducer is adjacent the region of maximum concentration of flux;
    support structure for enabling the at least one movable flux concentrators to move;
    a power source for causing the movable flux concentrators to move at a frequency within the predetermined frequency range;
    whereby as the plurality of movable flux concentrators move from a first position to a second position the region of maximum concentration of flux moves relative to the transducer from a first position in which the magnetic transducer is not exposed to flux flowing between the first and second movable flux concentrators to a second position in which the magnetic transducer is exposed to flux flowing between the first and second movable flux concentrators to thereby modulate the output from the magnetic transducer.

2. The sensor of claim 1 wherein the plurality of movable flux concentrators comprises a pair of movable flux concentrators which translate rigidly at a fixed distance apart, the pair of movable flux concentrators having a region of maxima therebetween, wherein when the pair of movable flux concentrators is in a first position the region of maxima is in a first location, and when the pair of movable flux concentrators is in a second position, the region of maxima is in a second position; and wherein transducer is in a fixed position relative to the pair of movable flux concentrators, whereby as the flux concentrators move from the first position to the second position the intensity of the flux sensed by the transducer is modulated as the region of maxima approaches and recedes from the location of the transducer.

3. The sensor of claim 1 wherein the at least one flux collector is not attached to the at least one movable flux concentrator and the at least one movable flux concentrator moves freely relative to the at least one flux collector and wherein the plurality of movable flux concentrators move at a frequency in the range of 5 khz to 60 khz.

4. The sensor of claim 3 wherein each of the plurality of movable flux concentrators has a comb drive operatively associated therewith to force the motion of the movable flux concentrator, and an associated motion sensor which detects movement of the flux concentrator in the form of capacitance which provides feedback to the operatively associated comb drive.

5. The sensor of claim 4 wherein the associated motion sensor further comprises an output which is amplified and inputted into the electrostatic comb drive causing the electrostatic comb drive to operate at its resonant frequency.

6. The sensor of claim 1 wherein the at least one flux collector comprises a support layer and a layer of a soft magnetic material which absorbs magnetic flux and wherein the magnetic transducer and the at least one flux concentrator are positioned substantially in the first plane on a silicon compound substrate and whereby the distance between the silicon compound substrate and the support structure is in the range of 2 to 8 microns.

7. The sensor of claim 6 further comprising at least one electrode associated with the plurality of movable flux concentrators including a first electrode operatively connected to said base and a corresponding second electrode attached to the plurality of movable flux concentrators such that when said pair of complementary electrodes are excited by a modulating electrical signal, the plurality of movable flux concentrators move at a prescribed frequency to modulate the magnetic field at the magnetic transducer and shift the frequency of the magnetic field that is sensed by the magnetic sensors to a higher frequency to thereby minimize 1/f-type noise of the magnetic transducer.

8. The sensor of claim 6 wherein the plurality of movable flux concentrators comprises two movable flux concentrators mounted to a single substrate substantially in the same plane which move together in tandem.

9. The sensor of claim 8, wherein each of the two movable flux concentrators has a mass and is supported by a spring, together forming a spring mass combination, the spring mass combination having a natural resonant frequency; the power source causing the plurality of movable flux concentrators to move substantially at the resonant frequency; the at least one flux collector being arranged so the mass of the at least one flux collector does not affect the resonant frequency of the spring mass combination.

10. The sensor of claim 9, wherein the magnetic transducer comprises one of a Hall effect type sensor, a magnetoresistive sensor, a MEMS sensor, a magneto-diode, a magneto-transistor, a MAGFET, a fluxgate, a miniature fluxgate magnetometer, a SQUID, a magnetoelectric sensor, and a magneto-optical sensor.

11. The sensor of claim 1 wherein the at least one flux collector has a first cross sectional area where magnetic flux may enter and a second cross sectional area from where magnetic flux may transfer onto at least one of the plurality of movable flux concentrators; the first cross sectional area being at least 1.5 times the area of the second cross sectional area.

12. The sensor of claim 11 wherein the ratio of the first cross sectional area to the second cross sectional area is greater than or equal to 1.5 and less than 15.

13. The sensor of claim 1 further wherein the plurality of movable flux concentrators comprise a pair of movable flux concentrators which move from a first position where the transducer is substantially shielded from the flux so that the flux received by the transducer is at a minimum, to a second position at which the flux received by the transducer is at a maximum, whereby the oscillatory motion modulates the output signal of the transducer.

14. The sensor of claim 1 wherein each of the plurality of movable flux concentrators has an operatively associated electrostatic comb drive.

15. The sensor of claim 1 wherein the transducer is operatively connected to a low noise amplifier which increases the intensity of the signal outputted by the transducer.

16. The sensor of claim 1 comprising a plurality of MEMS devices arranged in a configuration to provide enhanced detection capability.

17. The sensor of claim 1 comprising a plurality of MEMS devices arranged in series configurations.

18. The sensor of claim 1 wherein the plurality of movable flux concentrators move at a prescribed frequency to modulate the magnetic field at the magnetic transducer and shift the frequency of the magnetic field that is sensed by the magnetic transducer to a higher frequency to thereby minimize 1/f-type noise.

19. A microelectromechanical modulating magnetic sensor comprising:
a base;
a magnetic transducer supported by a first support structure, at least a portion of the magnetic transducer being located in a first plane; the magnetic transducer providing an output in response to a magnetic field associated with the base;
a plurality of movable flux concentrators positioned to move relative to the magnetic transducer; the plurality of movable flux concentrators having a region of maximum concentration of flux at a predetermined region associated with the positions of the plurality of movable flux concentrators;
at least one stationary flux collector positioned on the first support substantially within the first plane to collect and transfer flux for transfer onto at least one movable flux concentrator;
a second support structure operatively associated with the base for enabling the plurality of movable flux concentrators to move laterally in tandem substantially within a second plane parallel to the first plane; the at least one flux collector being located in the first plane so as to overlap a first of the plurality of movable flux concentrators to enable continuous flux transfer during the movement of the plurality of movable flux concentrators from the at least one stationary flux collector onto the first of the plurality of movable flux concentrators; and, during movement of the plurality of movable flux concentrators, flux is transferred from the first of the plurality of movable flux concentrators to a second of the plurality of movable flux concentrators; the first and second movable flux concentrators being positioned a fixed distance apart such that a region of maximum concentration of flux forms therebetween; the first and second movable flux concentrators moving in tandem from a first position in which one of the first and second movable flux concentrators shields the magnetic transducer from the flux which flows between the first and second movable flux concentrators to a second position in which the magnetic transducer is adjacent the region of maximum concentration of flux; the distance between the first and second planes being in the range of approximately 2 to 8 microns;
a power source for causing the movable flux concentrators to move at a frequency within the predetermined frequency range;
whereby as the at least one movable flux concentrator moves from a first position to a second position the region of maximum concentration of flux moves relative to the transducer to thereby modulate the output from the magnetic transducer.

20. A microelectromechanical modulating magnetic sensor comprising:
a magnetic transducer, at least part of which is positioned in a first plane and supported by a first support, the magnetic transducer providing an output in response to a magnetic field;
first and second movable flux concentrators positioned to move relative to the magnetic transducer in tandem substantially in a second plane substantially parallel to the first plane; the first and second movable flux concentrators being spaced apart from one another with a intermediate area therebetween such that magnetic flux flows into the intermediate area from the first to the second movable flux concentrator during operation of the sensor;
at least one flux collector, at least part of which is positioned in the first plane and fixedly mounted to the first support, the at least one flux collector operative to collect flux for transfer onto the first movable flux concentrator; the at least one flux collector being such that the at least one flux collector overlaps at least a portion of the first movable flux concentrator so as to allow flux transfer without inhibiting movement of the first movable flux concentrator; the first and second movable flux concentrators being positioned so as to move from a first position in which one of the first and second movable flux concentrators shields the magnetic transducer from the flux which flows between the first and second movable flux concentrators to a second position in which the magnetic transducer is adjacent the intermediate area so as to allow exposure of the magnetic transducer to the flux;

a power source for causing the movable flux concentrators to move at a frequency within a predetermined frequency range;

whereby as the first and second movable flux concentrators move from a first position to a second position the intermediate area moves relative to the transducer from a first position in which the magnetic transducer is not exposed to flux flowing between the first and second movable flux concentrators to a second position in which the magnetic transducer is exposed to flux flowing between the first and second movable flux concentrators to thereby modulate the output from the magnetic transducer.

* * * * *